US012057500B2

(12) United States Patent
Nakata et al.

(10) Patent No.: US 12,057,500 B2
(45) Date of Patent: Aug. 6, 2024

(54) POWER SEMICONDUCTOR DEVICE AND POWER CONVERTER

(71) Applicant: Mitsubishi Electric Corporation, Tokyo (JP)

(72) Inventors: Kazunari Nakata, Tokyo (JP); Kensuke Taguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 432 days.

(21) Appl. No.: 17/421,038

(22) PCT Filed: Feb. 5, 2020

(86) PCT No.: PCT/JP2020/004277
§ 371 (c)(1),
(2) Date: Jul. 7, 2021

(87) PCT Pub. No.: WO2020/170813
PCT Pub. Date: Aug. 27, 2020

(65) Prior Publication Data
US 2022/0059688 A1    Feb. 24, 2022

(30) Foreign Application Priority Data
Feb. 18, 2019 (JP) .................. 2019-026654

(51) Int. Cl.
*H01L 29/78* (2006.01)
*H01L 29/16* (2006.01)
(Continued)

(52) U.S. Cl.
CPC ...... *H01L 29/7811* (2013.01); *H01L 29/1608* (2013.01); *H01L 29/42356* (2013.01); *H01L 29/7813* (2013.01); *H02M 7/537* (2013.01)

(58) Field of Classification Search
CPC ............ H01L 29/7811; H01L 29/1608; H01L 29/42356; H01L 29/7813
See application file for complete search history.

(56) References Cited

U.S. PATENT DOCUMENTS

2012/0146055 A1    6/2012   Mitani et al.
2015/0228809 A1    8/2015   Sugiura
(Continued)

FOREIGN PATENT DOCUMENTS

JP    H04106979 A    4/1992
JP    H11307577 A    11/1999
(Continued)

OTHER PUBLICATIONS

International Search Report (PCT/ISA/210) with translation and Written Opinion (PCT/ISA/237) mailed on Apr. 14, 2020, by the Japan Patent Office as the International Searching Authority for International Application No. PCT/JP2020/004277.

(Continued)

*Primary Examiner* — Christine A Enad
(74) *Attorney, Agent, or Firm* — BUCHANAN INGERSOLL & ROONEY PC

(57) ABSTRACT

A power semiconductor device includes a termination region having a corner and an element region inside the termination region. An SiC substrate spans the element region and the termination region. An interlayer insulating film has an outer edge in the termination region. A source electrode is in contact with the SiC substrate in the element region, and has an outer edge on the interlayer insulating film in the termination region. An insulating protective film covers the outer edge of the interlayer insulating film and the outer edge of the source electrode, and has an inner edge on the source electrode. At the corner of the termination region, the outer edge of the interlayer insulating film has a radius of curvature R1, and the inner edge of the insulating protective film (Continued)

has a radius of curvature R2. The radius of curvature R2 is greater than the radius of curvature R1.

20 Claims, 19 Drawing Sheets

(51) Int. Cl.
  *H01L 29/423* (2006.01)
  *H02M 7/537* (2006.01)

(56) References Cited

U.S. PATENT DOCUMENTS

| | | | |
|---|---|---|---|
| 2019/0245043 A1* | 8/2019 | Uchida | H01L 29/0619 |
| 2020/0321258 A1* | 10/2020 | Kojima | H01L 29/1602 |
| 2021/0135002 A1 | 5/2021 | Sugawara et al. | |

FOREIGN PATENT DOCUMENTS

| | | |
|---|---|---|
| JP | 2007207960 A | 8/2007 |
| JP | 2009194127 A | 8/2009 |
| JP | 2015207780 A | 11/2015 |
| JP | 2016225469 A | 12/2016 |
| JP | 2017011176 A | 1/2017 |
| JP | 2017168602 A | 9/2017 |
| JP | 2017224711 A | 12/2017 |
| WO | 2018163286 A1 | 9/2018 |

OTHER PUBLICATIONS

Notice of Reasons for Refusal dated Mar. 15, 2022, issued in corresponding Japanese Patent Application No. 2021-501833, 13 pages including 7 pages of English Translation.

First Written Notice of Reasons for Refusal dated Dec. 20, 2023, issued in the corresponding Chinese Patent Application No. 202080013625.5, 15 pages including 8 pages of English Translation.

Office Action dated Feb. 29, 2024, issued in the corresponding German Patent Application No. 11 2020 000 853.3, 11 pages including 6 pages of English Translation.

* cited by examiner

F I G. 9
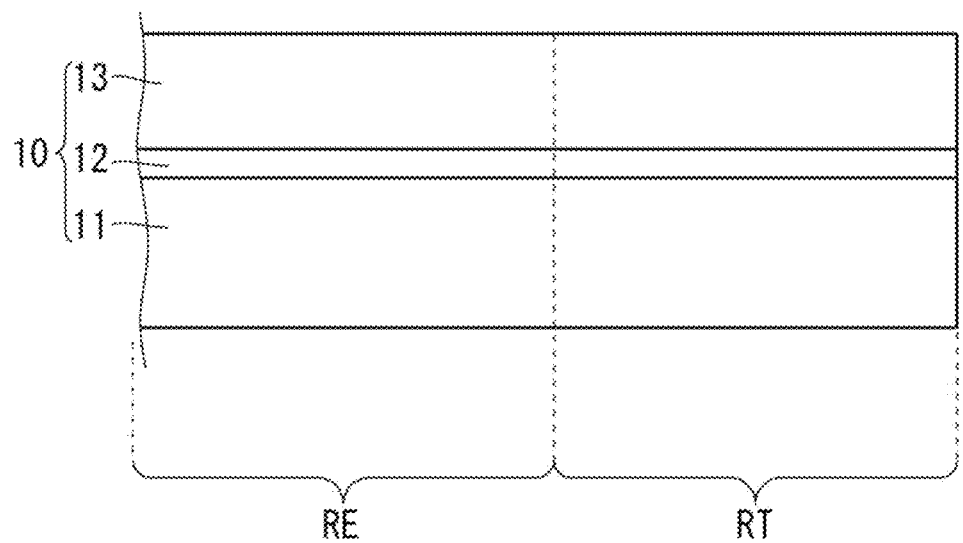
F I G. 1 0
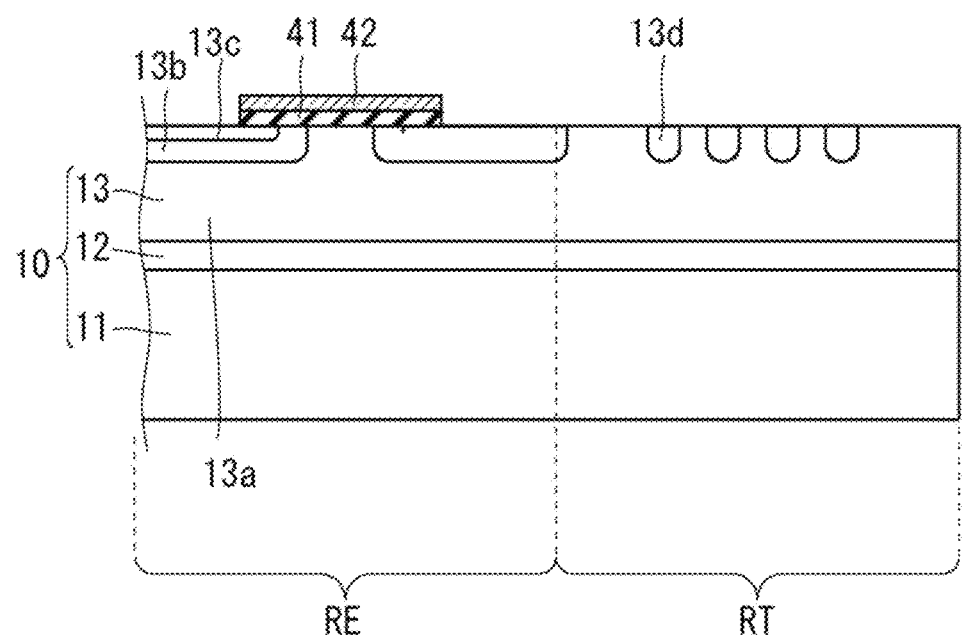

POWER SEMICONDUCTOR DEVICE AND POWER CONVERTER

TECHNICAL FIELD

The present invention relates to a power semiconductor device and a power converter.

BACKGROUND ART

Japanese Patent Application Laid-Open No. 2017-168602 (Patent Document 1) discloses a metal oxide semiconductor field effect transistor (MOSFET) as a power semiconductor device. The MOSFET includes a silicon carbide (SiC) substrate. One advantage of SiC is a high breakdown field strength. The surface of the MOSFET is covered with a polyimide film. The polyimide film has an opening to expose a source contact portion and a gate contact portion of a surface electrode.

Prior Art Document

Patent Document

Patent Document 1: Japanese Patent Application Laid-Open No. 2017-168602

SUMMARY

Problem to be Solved by the Invention

The above-mentioned polyimide film (an insulating protective film) is subject to stress, and is, in particular, subject to stress from a sealing member to seal the insulating protective film. For example, thermal stress is applied from the sealing member for a long time multiple times by thermal cycling due to heat generation during operation of the power semiconductor device. The insulating protective film is subject to large stress when the sealing member is formed.

Stress as described above can break the insulating protective film. Breakage of the insulating protective film causes a problem in that an original breakdown voltage cannot be secured, for example. Technology disclosed in the above-mentioned document fails to fully consider breakage of the insulating protective film.

The present invention has been conceived to solve a problem as described above, and it is an object of the present invention to provide a power semiconductor device capable of suppressing breakage of an insulating protective film.

Means to Solve the Problem

A power semiconductor device of the present invention includes a termination region having a corner and an element region inside the termination region. The power semiconductor device includes a semiconductor substrate, an interlayer insulating film, an electrode, and an insulating protective film. The semiconductor substrate spans the element region and the termination region. The interlayer insulating film has an outer edge on the semiconductor substrate in the termination region. The electrode is in contact with the semiconductor substrate in the element region, and has an outer edge on the interlayer insulating film in the termination region. The insulating protective film covers the outer edge of the interlayer insulating film and the outer edge of the electrode, and has an inner edge on the electrode. At the corner of the termination region, the outer edge of the interlayer insulating film has a radius of curvature R1, and the inner edge of the insulating protective film has a radius of curvature R2, the radius of curvature R2 being greater than the radius of curvature R1.

Effects of the Invention

The inner edge of the insulating protective film is typically likely to be an originating point of a crack of the insulating protective film, but, according to the present invention, the inner edge is less likely to be the originating point of the crack of the insulating protective film as the radius of curvature R2 is greater than the radius of curvature R1. Furthermore, since the radius of curvature R1 is smaller than the radius of curvature R2, a greater width of a portion of the insulating protective film elevated by the interlayer insulating film and the electrode is secured at the corner of the termination region. Resistance to stress applied to the inner edge of the insulating protective film on the electrode is thereby enhanced. Breakage of the insulating protective film can thereby be suppressed.

BRIEF DESCRIPTION OF DRAWINGS

FIG. 9 is a partial cross-sectional view schematically showing a first step of the method of manufacturing the power semiconductor element (power semiconductor device) in Embodiment 1 of the present invention.

FIG. 10 is a partial cross-sectional view schematically showing a second step of the method of manufacturing the power semiconductor element (power semiconductor device) in Embodiment 1 of the present invention.

DESCRIPTION OF EMBODIMENTS

Figure 1:
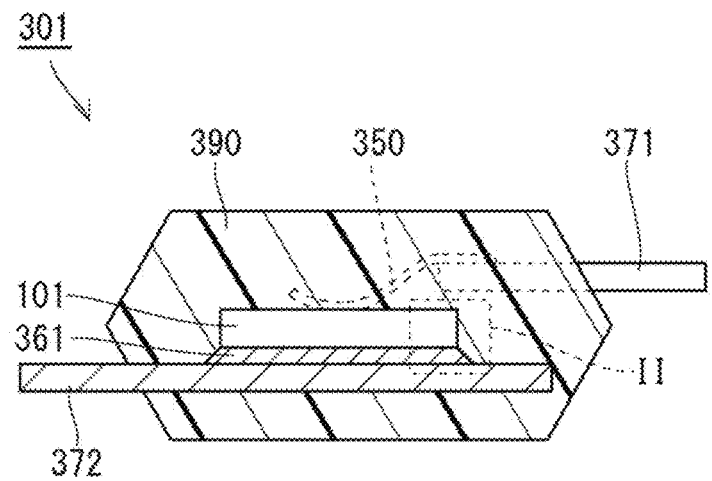
FIG. 1 is a cross-sectional view schematically showing a configuration of a power module (power semiconductor device) in Embodiment 1 of the present invention.

Embodiments of the present invention will be described below with reference to the drawings. The same or equivalent components bear the same reference signs in the drawings described below, and description thereof will be not repeated.

Embodiment 1

Configuration

Figure 2:
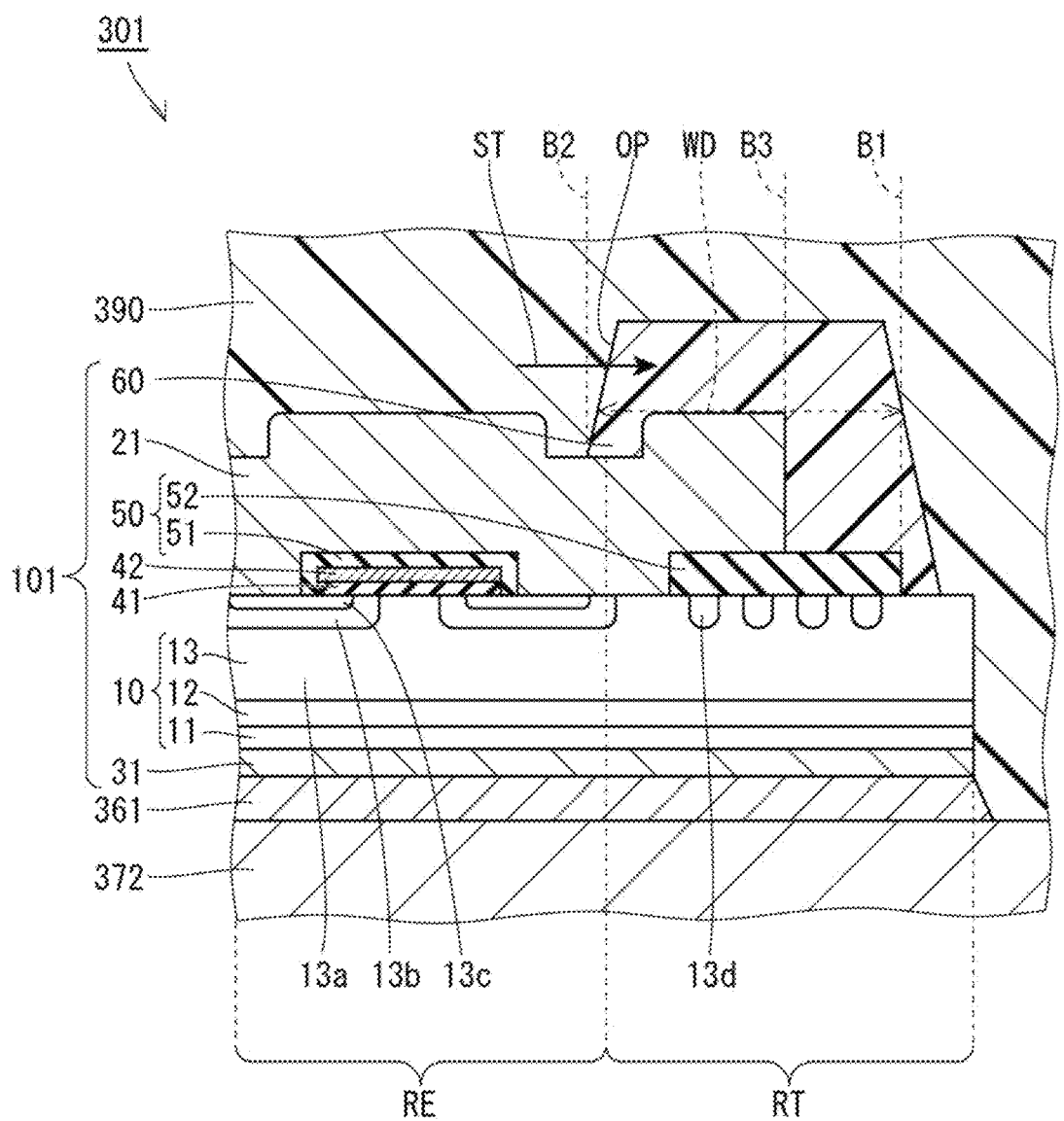
FIG. 2 is a schematic partial cross-sectional view corresponding to a region II of FIG. 1.

FIG. 1 is a cross-sectional view schematically showing a configuration of a power module 301 (power semiconductor device) in Embodiment 1. FIG. 2 is a schematic partial cross-sectional view corresponding to a region II (FIG. 1).

The power module 301 includes a power semiconductor element 101 (power semiconductor device), a sealing member 390, a lead frame 371, a lead frame 372, a bonding wire 350, and a solder layer 361.

The power semiconductor element 101 is a vertical semiconductor element, and is a MOSFET element in the present embodiment. For that purpose, the power semiconductor element 101 includes a source electrode 21 (FIG. 2) disposed on an upper side and a drain electrode 31 disposed on a lower side. The source electrode 21 is connected to the lead frame 371 by the bonding wire 350. The drain electrode 31 is connected to the lead frame 372 by the solder layer 361. The sealing member 390 seals the power semiconductor element 101, the bonding wire 350, a portion of the lead frame 371, and a portion of the lead frame 372. Specifically, the sealing member 390 covers the source electrode 21 and an insulating protective film 60 of the power semiconductor element 101 as shown in FIG. 2. The bonding wire 350 is made of aluminum, silver, or gold, for example.

Figure 3:
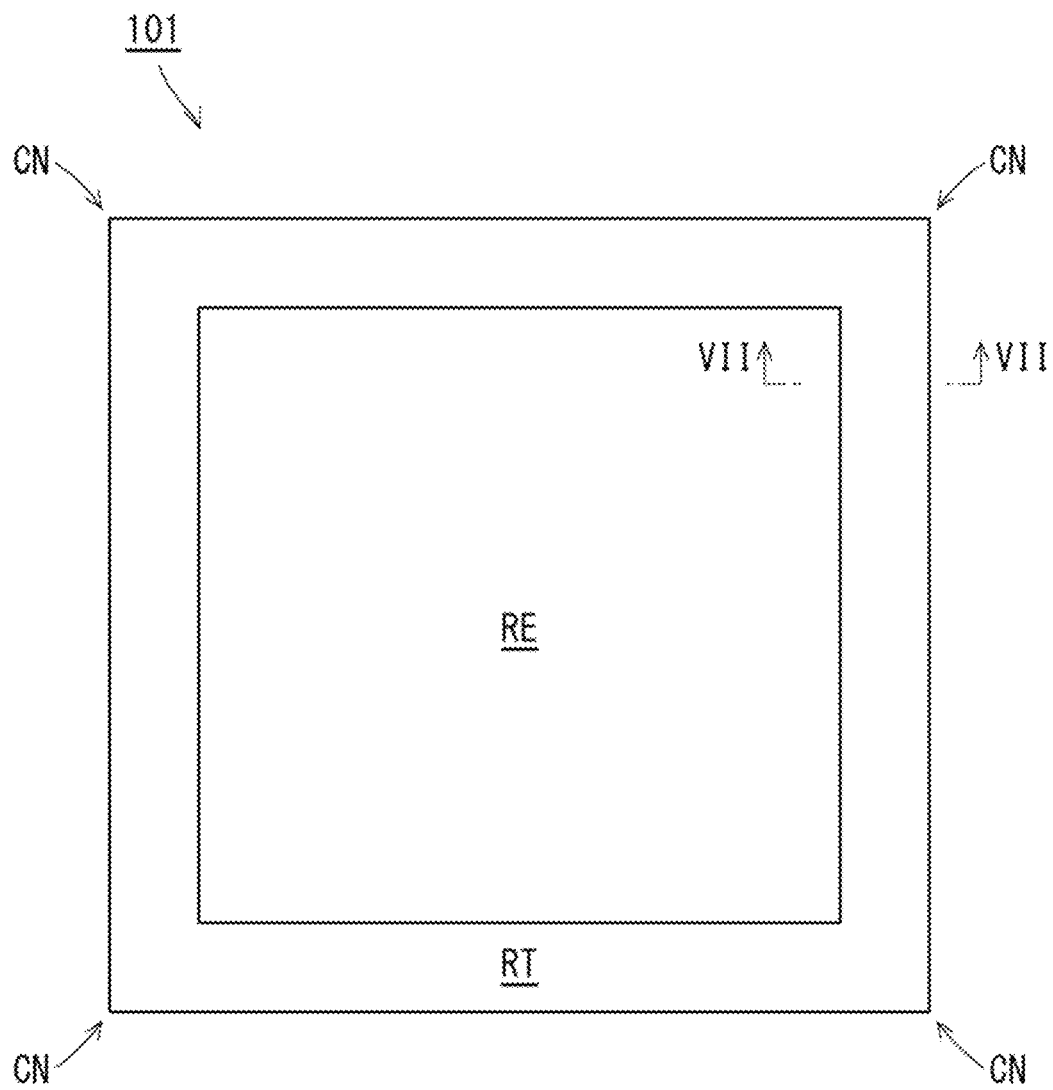
FIG. 3 is a plan view schematically showing the layout of a termination region and an element region of a power semiconductor element (power semiconductor device) included in the power module of FIG. 1.

FIG. 3 is a plan view schematically showing the layout of a termination region RT and an element region RE of the power semiconductor element 101. The power semiconductor element 101 includes the termination region RT having at least one corner CN and the element region RE inside the termination region RT. Typically, the power semiconductor element 101 is rectangular (including square), so that the termination region RT has four corners CN. The termination region RT preferably completely surrounds the element region RE.

A structure to perform a main function of the power semiconductor element 101 is provided in the element region RE. When the power semiconductor element 101 is the MOSFET as in the present embodiment, at least one MOS gate structure is disposed in the element region RE, and a plurality of cell regions each having a MOS gate structure are typically periodically arranged in the element region RE. Energization is performed in the element region RE. In the termination region RT, the MOS gate structure is not disposed, and a structure to secure a breakdown voltage is mainly disposed.

Figure 4:
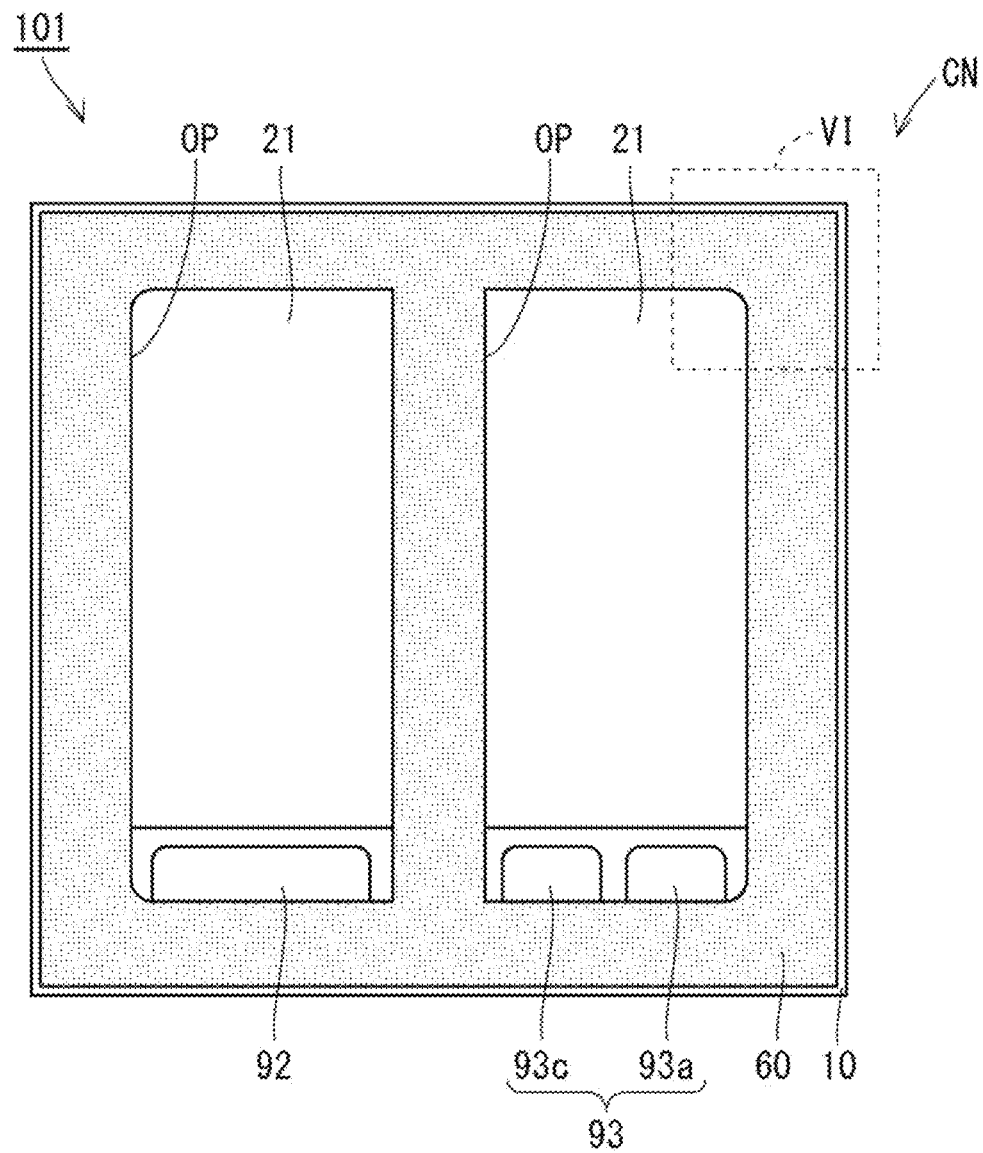
FIG. 4 is a plan view schematically showing a configuration of the power semiconductor element (power semiconductor device) included in the power module of FIG. 1.
Figure 5:
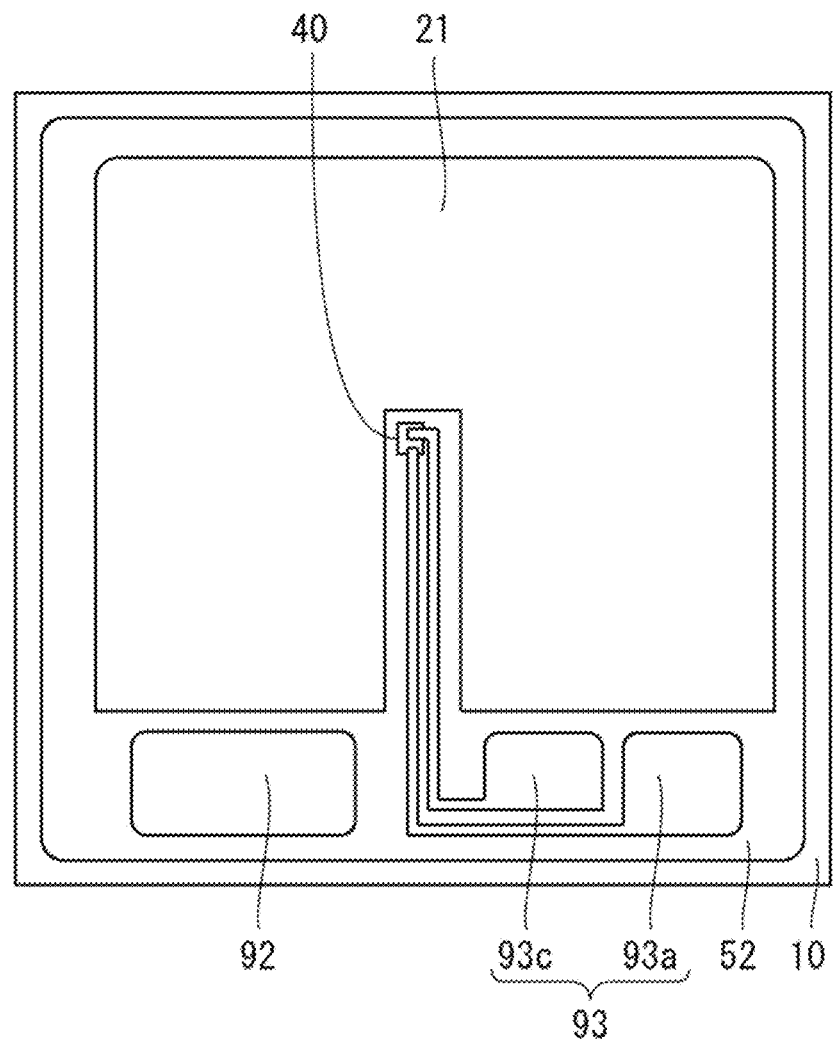
FIG. 5 is a plan view schematically showing the configuration of FIG. 4 without illustrating an insulating protective film.

FIG. 4 is a plan view schematically showing a configuration of the power semiconductor element 101. FIG. 5 is a plan view schematically showing the configuration of FIG. 4 without illustrating the insulating protective film 60. The power semiconductor element 101 includes an SiC substrate 10 (a semiconductor substrate), an interlayer insulating film 52, the insulating protective film 60, the source electrode 21, a gate pad electrode 92, a temperature sense diode 40, and a sense pad electrode 93.

The SiC substrate 10 spans the element region RE and the termination region RT (FIG. 3). The insulating protective film 60 covers the SiC substrate 10 over which the interlayer insulating film 52, the source electrode 21, the gate pad electrode 92, the temperature sense diode 40, and the sense pad electrode 93 are provided. The insulating protective film 60 has openings OP to at least partially expose each of the source electrode 21, the gate pad electrode 92, and the sense pad electrode 93. The openings OP preferably have an area equal to or greater than half of the area of the SiC substrate 10.

The sense pad electrode 93 includes an anode pad electrode 93a and a cathode pad electrode 93c. As shown in FIG. 5, a wiring portion having an end disposed in the vicinity of the center of the SiC substrate 10 extends from the anode pad electrode 93a. As shown in FIG. 5, a wiring portion having an end disposed in the vicinity of the center of the SiC substrate 10 also extends from the cathode pad electrode 93c. The temperature sense diode 40 is disposed at these ends. The temperature sense diode 40 includes an anode region and a cathode region to form a pn junction. The temperature sense diode 40 is covered with the insulating protective film 60. The temperature of the temperature sense diode 40 can be measured by detecting a forward voltage of the temperature sense diode 40. A representative temperature of the power semiconductor element 101 can more accurately be detected by locating the temperature sense diode 40 at the center of the SiC substrate 10. Control to interrupt a current in the power semiconductor element 101 may be performed when the detected temperature becomes excessively high to protect the power semiconductor element 101 against an abnormal condition.

Figure 6:
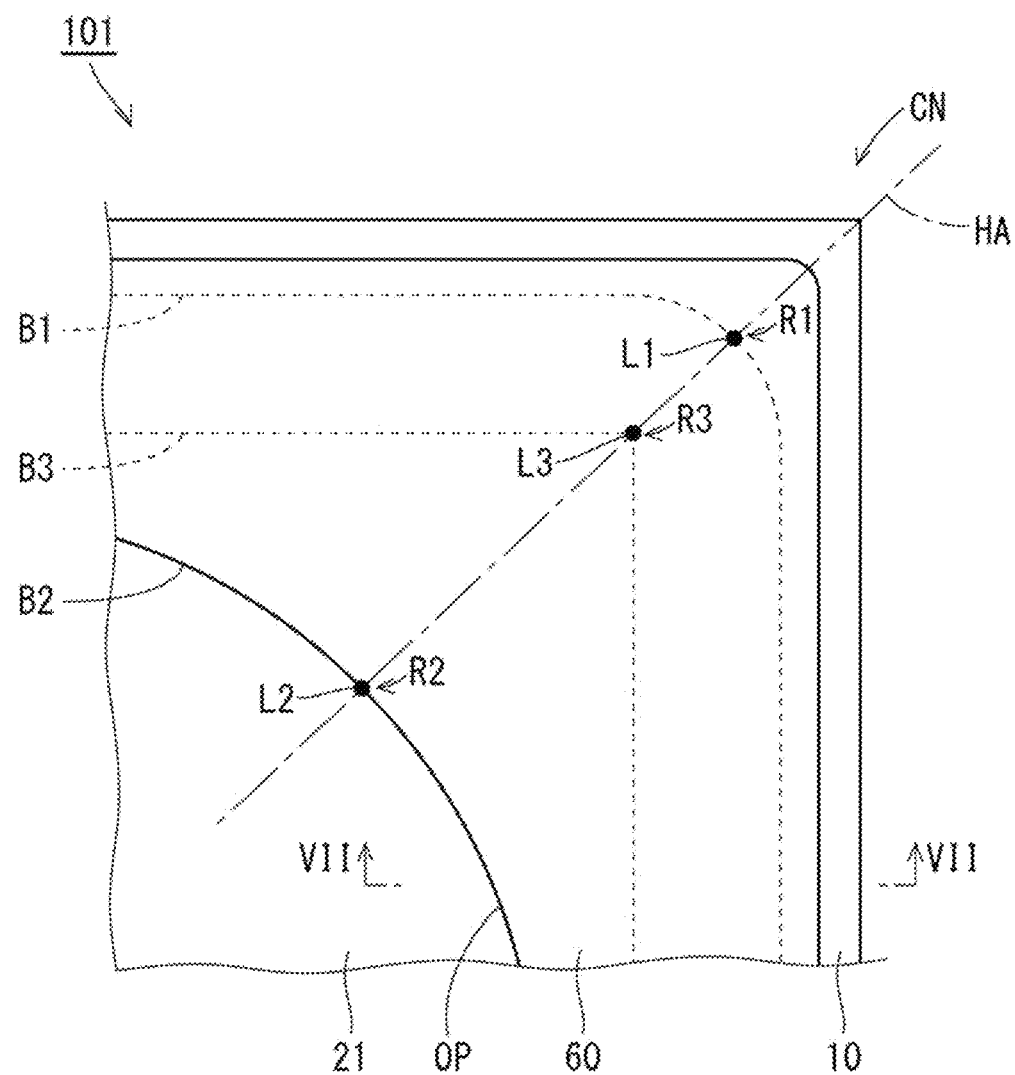
FIG. 6 is a partial plan view schematically showing a configuration of a region VI of FIG. 4.
Figure 7:
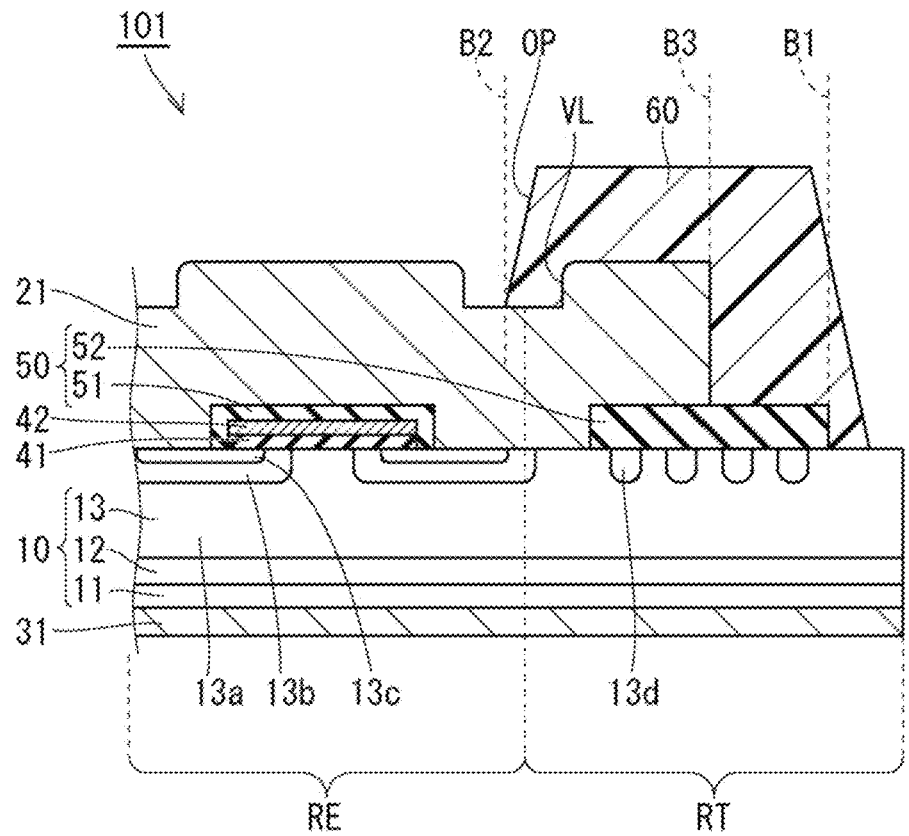
FIG. 7 is a schematic partial cross-sectional view along the line VII-VII of FIGS. 3 and 6.

FIG. 6 is a partial plan view schematically showing a configuration in the vicinity of a corner CN (a region VI (FIG. 4)) of the power semiconductor element 101. FIG. 7 is a schematic partial cross-sectional view along the line VII-VII (FIGS. 3 and 6). The field of view of FIG. 7 is similar to that of FIG. 2. In addition to the above-mentioned members, the power semiconductor element 101 includes a gate insulating film 41, a gate electrode 42, an interlayer insulating film 51, and the drain electrode 31. The interlayer insulating film 51 and the interlayer insulating film 52 may be simultaneously formed of the same material, and are hereinafter also collectively referred to as an interlayer insulating film 50.

The SiC substrate 10 (FIG. 7) includes an n-type substrate 11 (a monocrystalline substrate), an n-type buffer layer 12, and a semiconductor layer 13. The SiC substrate 10 may have a thickness of 100 µm or less. The buffer layer 12 is epitaxially formed on an upper surface of the n-type substrate 11. The semiconductor layer 13 is formed over the n-type substrate 11 through the buffer layer 12. The semiconductor layer 13 includes an n-type drift layer 13a spanning the element region RE and the termination region RT, a p-type base region 13b, an n-type source region 13c disposed in the element region RE, and a p-type guard ring region 13d disposed in the termination region RT. The source region 13c is separated from the drift layer 13a by the base region 13b. The drain electrode 31 is provided on a lower surface of the n-type substrate 11. The power semiconductor element 101 handles a current flowing between the drain electrode 31 and the source electrode 21, and the current is switched through control of a voltage of the gate electrode 42.

The gate insulating film 41 covers the base region 13b between the source region 13c and the drift layer 13a. The gate electrode 42 is provided over the base region 13b between the source region 13c and the drift layer 13a through the gate insulating film. A MOS structure thus formed enables use of the base region 13b between the source region 13c and the drift layer 13a as a channel of the MOSFET. In the element region RE, the source electrode 21 is in contact with the source region 13c of the SiC substrate 10.

The interlayer insulating film 52 has an outer edge B1 on the SiC substrate 10 in the termination region RT. FIG. 7 shows a case where a side wall of the interlayer insulating film 52 as a whole is vertical, but, if the side wall is inclined, the outer edge B1 may be defined by a lower end of the side wall. The source electrode 21 has an outer edge B3 on the interlayer insulating film 52 in the termination region RT. The outer edge B3 is located inward of the outer edge B1. The insulating protective film 60 covers the outer edge B1 of the interlayer insulating film 52 and the outer edge B3 of the source electrode 21, and has an inner edge B2 on the source electrode 21. The insulating protective film 60 has an outer edge located outward of the outer edge B1 of the interlayer insulating film 52. The shape shown in FIG. 6 may be grasped by optical microscopy of the power semiconductor element 101.

At the corner CN (FIG. 6) of the termination region RT, the outer edge B1 of the interlayer insulating film 52 has a radius of curvature R1, the inner edge B2 of the insulating protective film 60 has a radius of curvature R2, and the outer edge B3 of the source electrode 21 has a radius of curvature R3. The radius of curvature R2 is greater than the radius of curvature R1. The radius of curvature R2 is preferably 105% or more greater than the radius of curvature R1. The radius of curvature R2 is preferably 100 µm or more and 2000 µm or less. The radius of curvature R3 is preferably smaller than the radius of curvature R1.

In FIG. 6, an imaginary line HA divides the corner CN having an angle of 90° into two equal portions each having an angle of 45°. That is to say, the imaginary line HA corresponds to half the angle of the corner CN of the termination region RT.

The radius of curvature of a curved portion of the outer edge B1 of the interlayer insulating film 52 has a minimum value at a location L1 on the imaginary line HA. In the present embodiment, the outer edge B1 has a constant radius of curvature corresponding to the minimum value not only at the location L1 but also in the vicinity thereof. The curved portion of the outer edge B1 is thus an arc at the corner CN, and the radius of curvature R1 may be calculated based on the shape of the arc.

Similarly, the radius of curvature of a curved portion of the inner edge B2 of the insulating protective film 60 has a minimum value at a location L2 on the imaginary line HA. In the present embodiment, the inner edge B2 has a constant radius of curvature corresponding to the minimum value not only at the location L2 but also in the vicinity thereof. The curved portion of the inner edge B2 is thus an arc at the corner CN, and the radius of curvature R2 may be calculated based on the shape of the arc.

Similarly, the radius of curvature of a curved portion of the outer edge B3 of the source electrode 21 has a minimum value at a location L3 on the imaginary line HA. In the present embodiment, the outer edge B3 has a constant radius of curvature corresponding to the minimum value not only at the location L3 but also in the vicinity thereof. The curved portion of the outer edge B3 is thus an arc at the corner CN, and the radius of curvature R3 may be calculated based on the shape of the arc.

The shapes of the outer edge B1, the inner edge B2, and the outer edge B3, however, are not limited to those shown in FIG. 6. Modifications of the shapes of these edges will be described later.

The insulating protective film 60, the interlayer insulating film 52, and the sealing member 390 (FIG. 2) are made of different materials. The insulating protective film 60 contains organic matter, and may be made of organic matter. The insulating protective film 60 preferably contains polyimide, and may be made of polyimide. A silicone resin may be used in place of polyimide. The insulating protective film 60 separates at least a portion of the outer edge B3 of the source electrode 21 and the sealing member 390 (FIG. 2). Stress applied from the sealing member 390 to the outer edge B3 of the source electrode 21 is thereby suppressed.

The interlayer insulating film 52 contains inorganic matter, and may be made of inorganic matter. The insulating protective film 60 has a greater coefficient of linear thermal expansion than the interlayer insulating film 52. The sealing member 390 contains a thermosetting resin. The thermosetting resin preferably includes an epoxy resin. The sealing member 390 may contain an inorganic filler dispersed in the resin. The interlayer insulating film 52 insulates the outer edge B3 of the source electrode 21 and the SiC substrate 10. A high voltage (e.g., approximately 1200 V) corresponding to a breakdown voltage of the power semiconductor element 101 can be applied to the interlayer insulating film 52, so that the interlayer insulating film 52 is required to have high breakdown voltage performance. The interlayer insulating film 52 is thus preferably made of a material having a high breakdown field strength, and, in association therewith, is preferably made of a material less likely to absorb moisture.

The sealing member 390 has a greater coefficient of linear thermal expansion than the insulating protective film 60. The interlayer insulating film 52 has a smaller coefficient of linear thermal expansion than the sealing member 390.

Manufacturing Method

Figure 8:
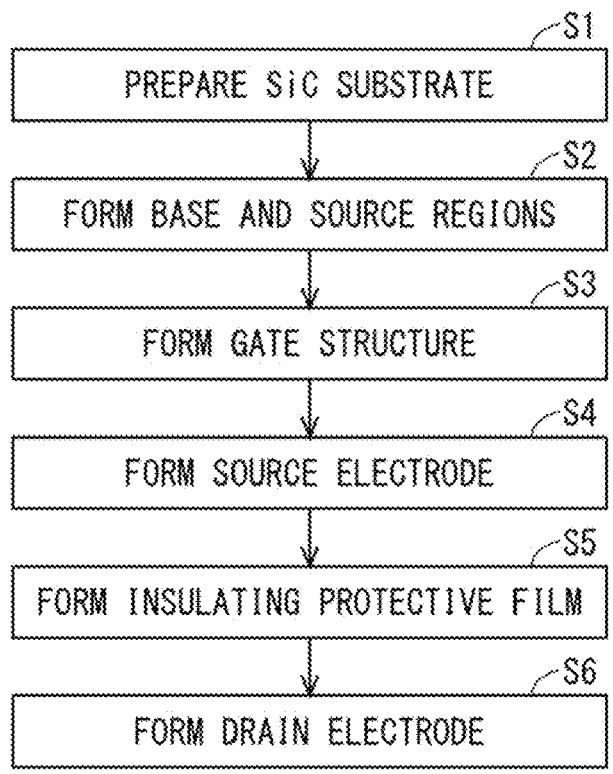
FIG. 8 is a flowchart schematically showing a method of manufacturing the power semiconductor element (power semiconductor device) in Embodiment 1 of the present invention.

FIG. 8 is a flowchart schematically showing a method of manufacturing the power semiconductor element 101 (FIG. 7). FIGS. 9 to 13 are partial cross-sectional views schematically showing the first to fifth steps of the method of manufacturing the power semiconductor element 101.

Referring to FIG. 9, the SiC substrate 10 is prepared in step S1 (FIG. 8). Specifically, the n-type buffer layer 12 and the n-type semiconductor layer 13 are epitaxially grown in the stated order on the upper surface of the n-type substrate 11. A portion of the semiconductor layer 13 is used as the drift layer 13a (FIG. 7) as it is. The impurity concentration and the thickness of the semiconductor layer 13 may be determined in accordance with a required breakdown voltage. The buffer layer 12 makes the influence of a defect and the like of the n-type substrate 11 less likely to be transferred to the semiconductor layer 13, and the thickness of the buffer layer 12 is preferably 0.1 µm or more, and more preferably 0.3 µm or more. The buffer layer 12 is typically only required to have a thickness of 10 µm or less.

Referring to FIG. 10, the p-type base region 13b, the p-type guard ring region 13d, and the n-type source region 13c are formed by ion implantation into the semiconductor layer 13 in step S2 (FIG. 8). Ion implantation can selectively be performed on the semiconductor layer 13 by using an implant mask, such as a resist. Boron (B) or aluminum (Al) is used as an impurity to impart p-type conductivity, for example. Phosphorus (P) or nitrogen (N) is used as an impurity to impart n-type conductivity, for example. The base region 13b and the guard ring region 13d may be simultaneously formed, but are preferably formed separately so that the guard ring region 13d has a greater depth than the base region 13b. The SiC substrate 10 is then heat treated using a heat treatment apparatus (not shown) to electrically activate the implanted impurity.

Next, a gate structure is formed in step S3 (FIG. 8). Specifically, the gate insulating film 41 is first formed by thermal oxidation or deposition. Deposition is chemical vapor deposition, for example. The gate electrode 42 is formed, for example, by depositing an n-type polysilicon layer on the gate insulating film 41. The gate electrode 42 is then patterned. By patterning, the gate electrode 42 is removed from a portion of the source region 13c in the element region RE. The gate electrode 42 is also removed in the termination region RT. Furthermore, an exposed portion of the gate insulating film 41 is removed by photolithography technology and etching technology.

Figure 11:
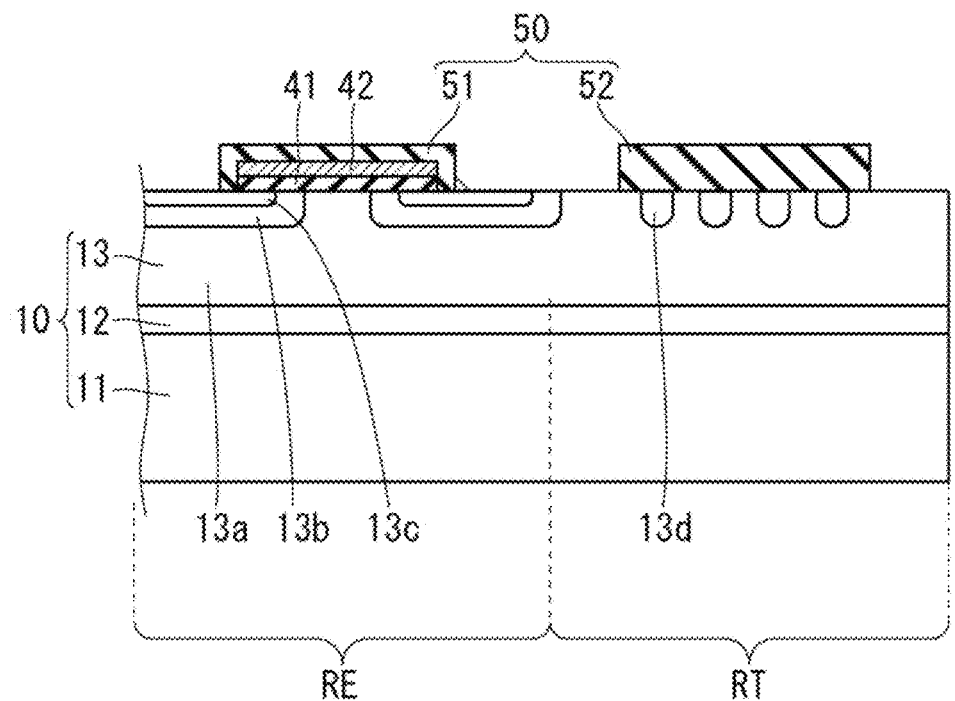
FIG. 11 is a partial cross-sectional view schematically showing a third step of the method of manufacturing the power semiconductor element (power semiconductor device) in Embodiment 1 of the present invention.

Referring to FIG. 11, the interlayer insulating film 50 is then formed by deposition and patterning. A material to be deposited is silicon nitride ($Si_xN_y$) or silicon oxide ($SiO_2$), for example. The interlayer insulating film 52 preferably has a thickness of 0.5 µm or more and 2.0 µm or less to enable reliable interruption of an current under an environment of at least one of a high temperature (150° C. or more) and high humidity (70% RH or more).

The temperature sense diode 40 (FIG. 5) may be formed by a partial region of the above-mentioned n-type polysilicon layer and a p-type polysilicon layer formed by implantation of boron (B) and the like into a portion of the partial region. As a modification, the temperature sense diode 40 may be formed by a partial region of a p-type polysilicon layer deposited in place of the n-type polysilicon layer and an n-type polysilicon layer formed by implantation of an impurity into a portion of the partial region. As another modification, the temperature sense diode 40 may be formed on the interlayer insulating film 50.

Figure 12:
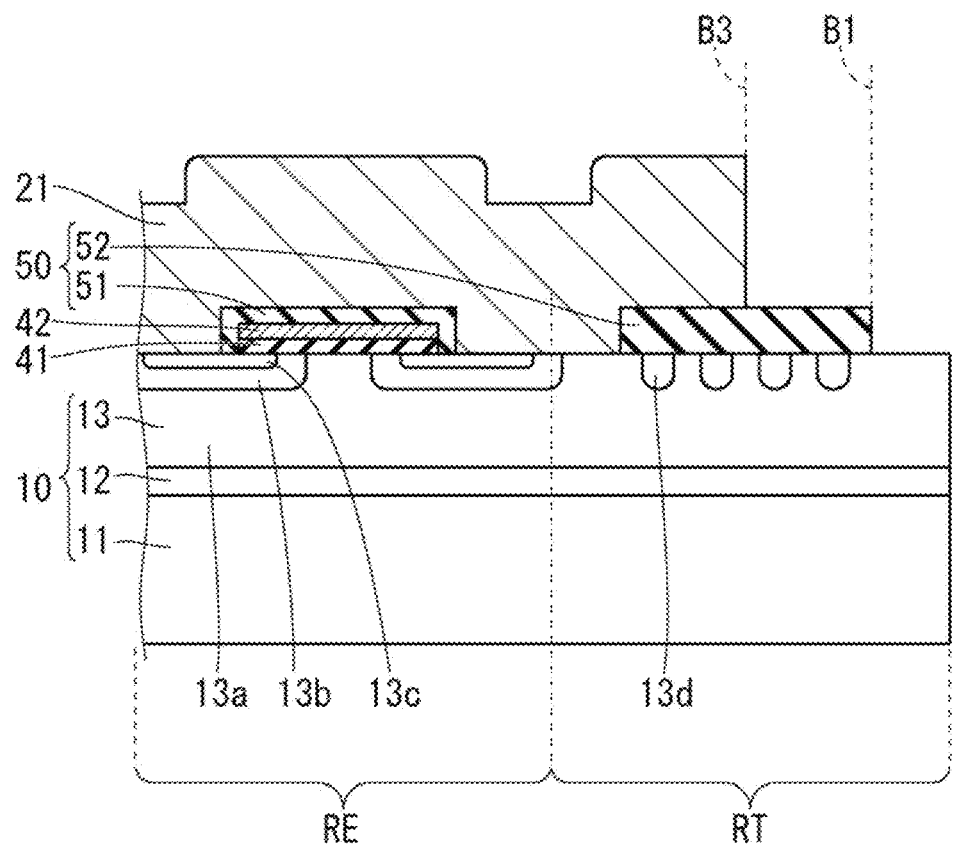
FIG. 12 is a partial cross-sectional view schematically showing a fourth step of the method of manufacturing the power semiconductor element (power semiconductor device) in Embodiment 1 of the present invention.

Referring to FIG. 12, the source electrode 21 is formed by deposition of metal (including an alloy) and patterning in step S4 (FIG. 8). Specifically, aluminum, an aluminum alloy, or nickel is deposited, for example. Examples of the aluminum alloy include an aluminum-silicon (Al—Si) alloy and an aluminum-silicon-copper (Al—Si—Cu) alloy. To prevent interdiffusion between the material to be deposited in this case and SiC of the SiC substrate 10, a barrier metal layer made of titanium or a titanium compound, such as titanium nitride (TiN), may be formed in advance. Reliability can thereby be further improved.

Figure 13:
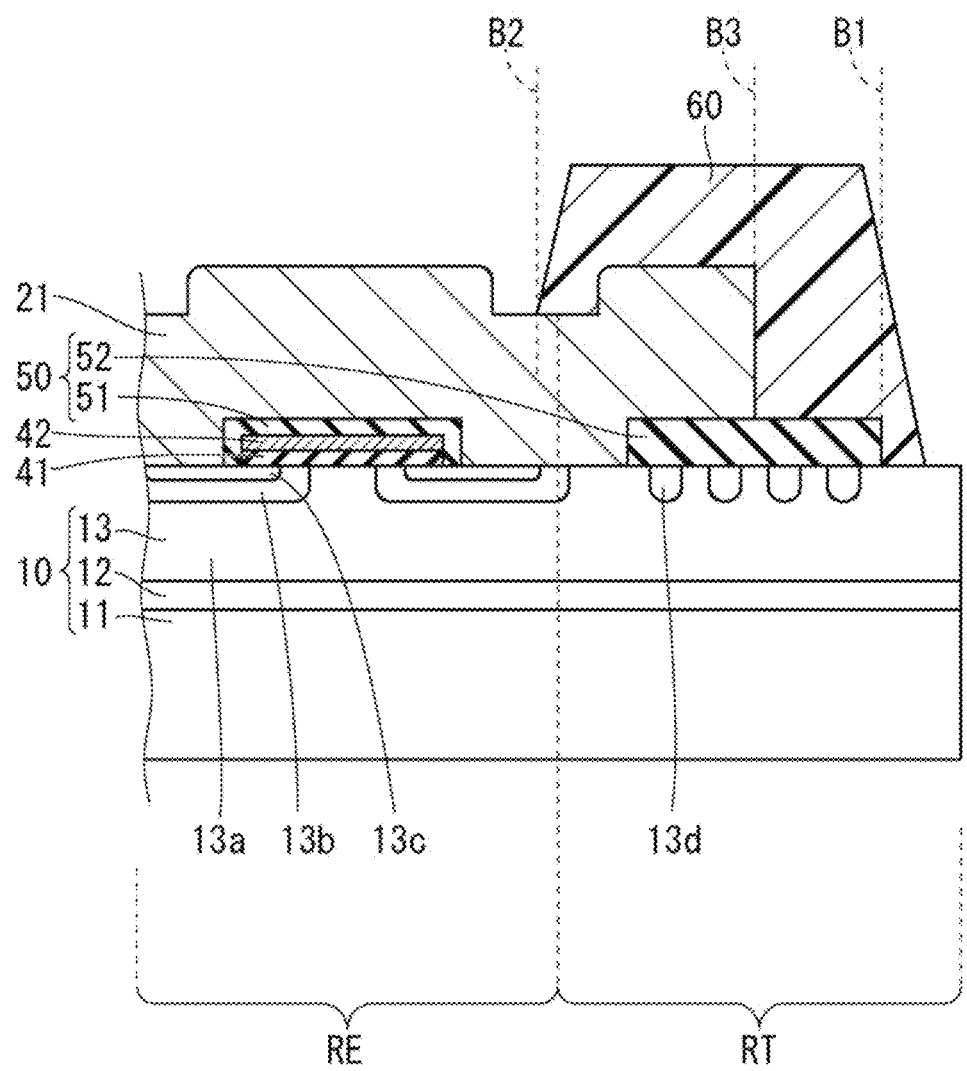
FIG. 13 is a partial cross-sectional view schematically showing a fifth step of the method of manufacturing the power semiconductor element (power semiconductor device) in Embodiment 1 of the present invention.

Referring to FIG. 13, the insulating protective film 60 is formed in step S5 (FIG. 8). A material for the insulating protective film 60 is a polyimide resin or a silicone resin, for example. It is preferable to use photolithography technology to impart a desired shape to the insulating protective film 60 with high accuracy, and etching technology may also be used. Etching can be omitted by using a photosensitive resin as the material for the insulating protective film 60. In particular, when the photosensitive resin is of a positive type, a portion (a portion inward of the outer edge B3 of the source electrode 21 in FIG. 6) of a photosensitive resin film to be the insulating protective film 60 on the source electrode 21 is exposed to a relatively large amount of light due to reflection of light from metal forming the source electrode 21 in an exposing step of the photolithography technology. In contrast, a portion of the photosensitive resin film to be the insulating protective film 60 away from the source electrode 21 (a portion outward of the outer edge B3 of the source electrode 21 in FIG. 6) is exposed to a relatively small amount of light. Due to such a difference in amount of light exposure, the radius of curvature at the corner on the side of the outer edge of the insulating protective film 60 (the radius of curvature of the outer edge of the insulating protective film 60 in the vicinity of an intersection of the outer edge and the imaginary line HA in FIG. 6) is likely to be reduced, whereas the radius of curvature R2 (FIG. 6) at the corner on the side of the inner edge B2 of the insulating protective film 60 is likely to be increased. The insulating protective film 60 having the above-mentioned relationship R2>R1 is easily formed when the photosensitive resin is used. A formation method, however, is not limited to this method, and screen printing technology or drawing technology may be used. Next, a portion of the SiC substrate 10 on a side of a lower surface thereof is removed by machining as necessary to reduce the thickness of the SiC substrate 10.

For example, the lower surface of the SiC substrate 10 is ground using a grinding wheel having alumina or diamond abrasive grains.

Referring again to FIG. 7, the drain electrode 31 is formed on the lower surface of the SiC substrate 10 in step S6 (FIG. 8). For example, a nickel film having a thickness of approximately 600 nm is formed by sputtering. In this case, it is preferable to first form a nickel film having a thickness of approximately 100 nm, anneal the film by laser irradiation, and then stack thereon a nickel film having a thickness of approximately 500 nm. Such annealing can provide a better connection between the SiC substrate 10 and the drain electrode 31, and can thus reduce an on-resistance of the power semiconductor element 101. A surface protective film made of gold or silver is preferably formed on the nickel film, for example, to prevent oxidation. Reduction in solder wettability due to oxidation of the surface of the drain electrode 31 when the drain electrode 31 is soldered is thereby prevented. A better junction state is thereby obtained. The surface protective film is made of gold or silver, for example.

The power semiconductor element 101 is obtained by the above-mentioned steps.

Experimental Result

Figure 14:
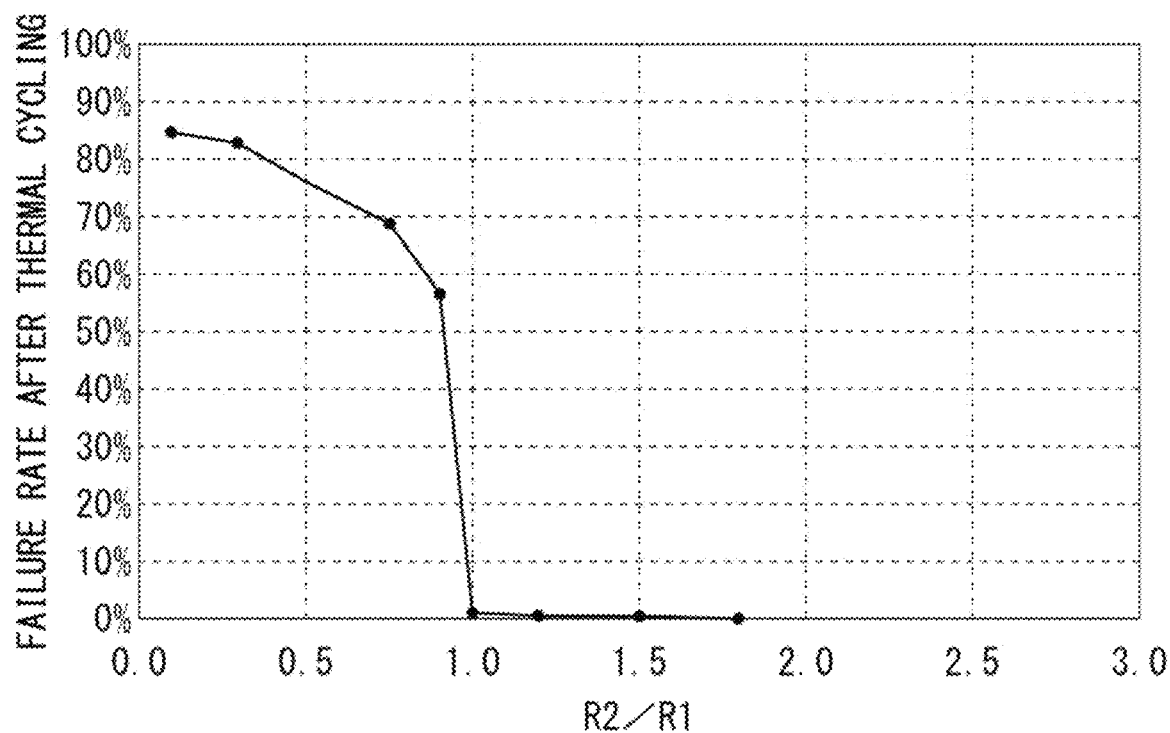
FIG. 14 is a graph showing an experimental result of a relationship between a ratio R2/R1 of radii of curvature of the power semiconductor element shown in FIG. 7 and a failure rate of the power module after thermal cycling.

FIG. 14 is a graph showing an experimental result of a relationship between a ratio R2/R1 (see FIG. 6) of radii of curvature and a failure rate of the power module 301 after thermal cycling. Specifically, the power module 301 was subjected to a temperature change between −50° C. and 175° C. for 1000 cycles, and then a leakage current was measured. The power module 301 was determined to fail when a value of the leakage current was increased by three or more orders of magnitude relative to a normal value.

It was found, from the experimental result, that the failure rate could be reduced when the ratio R2/R1 was one or more, that is, when the radius of curvature R2 was equal to or greater than the radius of curvature R1. The failure rate was rapidly increased when the ratio R2/R1 fell below one, so that it was found that the ratio R2/R1 was preferably more than one, that is, the radius of curvature R2 was preferably greater than the radius of curvature R1 to more reliably reduce the failure rate.

When the insulating protective film 60 of a defective product was examined, a crack from the inner edge B2 was observed. It is speculated that the crack is due to a difference in coefficient of linear thermal expansion between members, and is, in particular, due to stress ST (FIG. 2) applied to the insulating protective film 60 by the sealing member 390 surrounded by the insulating protective film 60 at an elevated temperature.

Effects

As described above, the curved portion of the inner edge B2 (FIG. 6) of the insulating protective film 60 is typically likely to be an originating point of a crack of the insulating protective film 60. According to the present embodiment, the inner edge B2 is less likely to be the originating point of the crack of the insulating protective film 60 as the radius of curvature R2 is greater than the radius of curvature R1. Furthermore, since the radius of curvature R1 is smaller than the radius of curvature R2, a greater width of a portion of the insulating protective film 60 elevated by the interlayer insulating film 52 and the source electrode 21 is secured at the corner CN of the termination region RT. Specifically, a greater width WD of an upper portion of the insulating protective film 60 is secured in FIG. 2. Resistance of the insulating protective film 60 to the stress ST (FIG. 2) is thereby enhanced. Breakage of the insulating protective film 60 can thereby be suppressed.

The sealing member 390 may contain the thermosetting resin. In this case, the sealing member 390 is harder than a gel material, and thus large stress is likely to be applied from the sealing member 390 to the insulating protective film 60. According to the present embodiment, breakage of the insulating protective film 60 can be suppressed even under such large stress. The sealing member 390 may contain the inorganic filler dispersed in the thermosetting resin. In this case, larger stress can be applied from the sealing member 390 to the insulating protective film 60. According to the present embodiment, breakage of the insulating protective film 60 can be suppressed even under such larger stress.

The sealing member 390 may have a greater coefficient of linear thermal expansion than the insulating protective film 60. According to the present embodiment, breakage of the insulating protective film 60 due to stress generated by the difference in coefficient of linear thermal expansion can effectively be suppressed.

The interlayer insulating film 52 may have a smaller coefficient of linear thermal expansion than the sealing member 390. In this case, breakage of the insulating protective film 60 outside the outer edge of the interlayer insulating film 52 is suppressed.

SiC as a material for the SiC substrate 10 has a high breakdown field strength. By utilizing the properties, the width (lateral dimensions in FIGS. 2 and 4) of a portion of the SiC substrate 10 in the termination region RT can be reduced to approximately one-tenth of that in a case of Si, for example. In this case, the width of the insulating protective film 60 is also required to be reduced to approximately one-tenth of that in the case of Si, for example. It is thus difficult to secure mechanical strength of the insulating protective film 60 simply by increasing the width of the insulating protective film 60. According to the present embodiment, breakage of the insulating protective film 60 due to stress can be suppressed even under such constraints. In other words, the present embodiment is particularly effective when the SiC substrate 10 is used as the semiconductor substrate. The material for the semiconductor substrate is not limited to SiC as will be described in detail below. The above-mentioned effect of enhancing resistance of the insulating protective film 60 to the stress ST (FIG. 2) is obtained regardless of the material for the semiconductor substrate.

The SiC substrate 10 may have a thickness of 100 µm or less. This provides the advantage that resistance on an electrical path along a thickness direction can be suppressed. On the other hand, the SiC substrate 10 having a small thickness is likely to warp, and, due to the warp, stress applied to the insulating protective film 60 can increase. According to the present embodiment, breakage of the insulating protective film 60 due to the increase in stress can be suppressed.

The openings OP (FIG. 4) of the insulating protective film 60 preferably have the area equal to or greater than half of the area of the SiC substrate 10. An electrical connection to the outside (e.g., a connection of the bonding wire) can thereby be provided in a wider region of the power semiconductor element 101.

The radius of curvature R3 (FIG. 6) is preferably smaller than the radius of curvature R1. First, the portion of the insulating protective film 60 elevated by the source electrode 21 thus has a greater width at the corner CN of the termination region RT (see FIG. 2). Resistance to the stress ST (FIG. 2) applied to the inner edge of the insulating protective film 60 on the source electrode 21 is thereby enhanced. Breakage of the insulating protective film 60 can thereby be further suppressed. Second, the outer edge B3 of the source electrode 21 can more reliably be located on the interlayer insulating film 52 (see FIG. 7) even if a patterning error in a manufacturing step is large at the corner CN of the termination region RT.

The radius of curvature R2 is greater than the radius of curvature R1 (see FIG. 6), so that a puddle is less likely to be formed in the vicinity of the curved portion of the inner edge B2 of the insulating protective film 60 after a wetting step at the manufacture. For example, a developer puddle is less likely to be formed after a development step when the polyimide film as the insulating protective film 60 is patterned by the photolithography technology. A problem caused due to the puddle, typically abnormal appearance, can thereby be mitigated. From this point of view, the radius of curvature R2 is preferably at least 1.5 times the radius of curvature R1.

Modifications of Shapes of Edges

In the present embodiment, as described above with reference to FIG. 6, the outer edge B1, the inner edge B2, and the outer edge B3 have arc shapes in the vicinity of the imaginary line HA, and the radius of curvature R1, the radius of curvature R2, and the radius of curvature R3 can be calculated based on the arc shapes. The shapes of these edges, however, are not limited to those shown in FIG. 6.

Specifically, the curved portion of the outer edge B1 of the interlayer insulating film 52 may have a shape that cannot substantially be considered as an arc at the corner CN. Also in this case, the radius of curvature of the curved portion of the outer edge B1 typically has a minimum value at the location L1 on the imaginary line HA at the corner CN. The radius of curvature R1 can thus be calculated at the location L1. In contrast, if the curved portion of the outer edge B1 has a minimum value at a location away from the imaginary line HA, the minimum value may be calculated as the radius of curvature R1. The radius of curvature at a certain location on a curve can herein be determined by fitting an arc to the curve within a range having a diameter of 10 μm around the location.

Similarly, the curved portion of the inner edge B2 of the insulating protective film 60 may have a shape that cannot substantially be considered as an arc at the corner CN. Also in this case, the radius of curvature of the curved portion of the inner edge B2 typically has a minimum value at the location L2 on the imaginary line HA at the corner CN. The radius of curvature R2 can thus be calculated at the location on the imaginary line HA. In contrast, if the curved portion of the inner edge B2 has a minimum value at a location away from the imaginary line HA, the minimum value may be calculated as the radius of curvature R2. The radius of curvature at a certain location on a curve can herein be determined by fitting an arc to the curve within a range having a diameter of 10 μm around the location.

Similarly, the curved portion of the outer edge B3 of the source electrode 21 may have a shape that cannot substantially be considered as an arc at the corner CN. Also in this case, the radius of curvature of the curved portion of the outer edge B3 typically has a minimum value at the location L3 on the imaginary line HA at the corner CN. The radius of curvature R3 can thus be calculated at the location on the imaginary line HA. In contrast, if the curved portion of the outer edge B3 has a minimum value at a location away from the imaginary line HA, the minimum value may be calculated as the radius of curvature R3. The radius of curvature at a certain location on a curve can herein be determined by fitting an arc to the curve within a range having a diameter of 10 μm around the location.

Values of the radius of curvature R1, the radius of curvature R2, and the radius of curvature R3 at the corner CN are values for curved shapes that are convex toward the edge of the SiC substrate 10. Shapes that are convex in an opposite direction are ignored in calculation of the above-mentioned radii of curvature.

Other Modifications

A case where the gate structure is a planer gate structure has been described in detail in the present embodiment, but the gate structure may be a trench gate structure. An n-channel MOSFET has been described so far, but a p-channel MOSFET may be manufactured by reversing the p-type conductivity and the n-type conductivity. A case where the semiconductor layer 13 includes the guard ring region 13d in the termination region RT has been described, but a configuration of an impurity region in the termination region RT may be selected as appropriate in accordance with a breakdown voltage that the power semiconductor element 101 is required to have.

A case where the semiconductor substrate is the SiC substrate, that is, a substrate entirely made of SiC has been described, but a semiconductor substrate including a portion made of SiC and a portion made of a semiconductor other than SiC may be used in place of the SiC substrate. Alternatively, a semiconductor substrate not including the portion made of SiC, typically a silicon (Si) substrate, may be used.

The MOSFET as the power semiconductor element has been described in detail, but the power semiconductor element is not limited to the MOSFET. The power semiconductor element is a switching element, a diode element, or a combination of them, for example. The switching element is a metal insulator semiconductor field effect transistor (MISFET) or an insulated gate bipolar transistor (IGBT), for example. The diode element is a Schottky barrier diode, for example.

Another sense element may be provided in place of the temperature sense diode 40. The sense pad electrode 93 and the temperature sense diode 40 may be omitted.

Embodiment 2

Configuration

Figure 15:
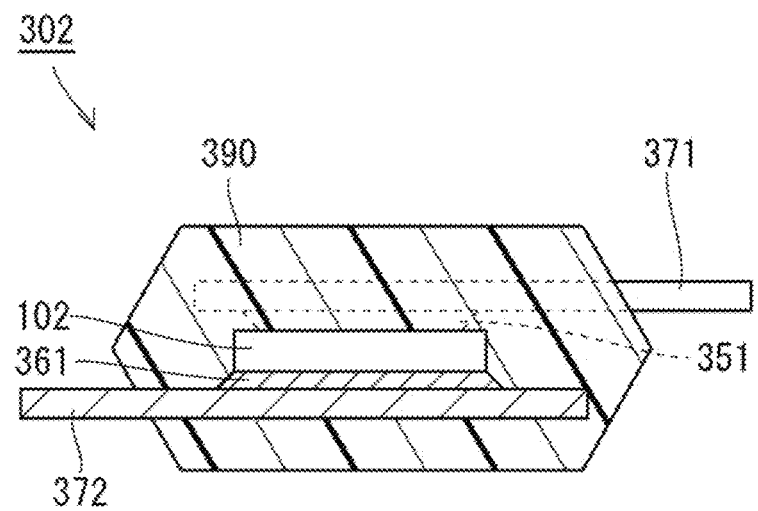
FIG. 15 is a cross-sectional view schematically showing a configuration of a power module (power semiconductor device) in Embodiment 2 of the present invention.
Figure 16:
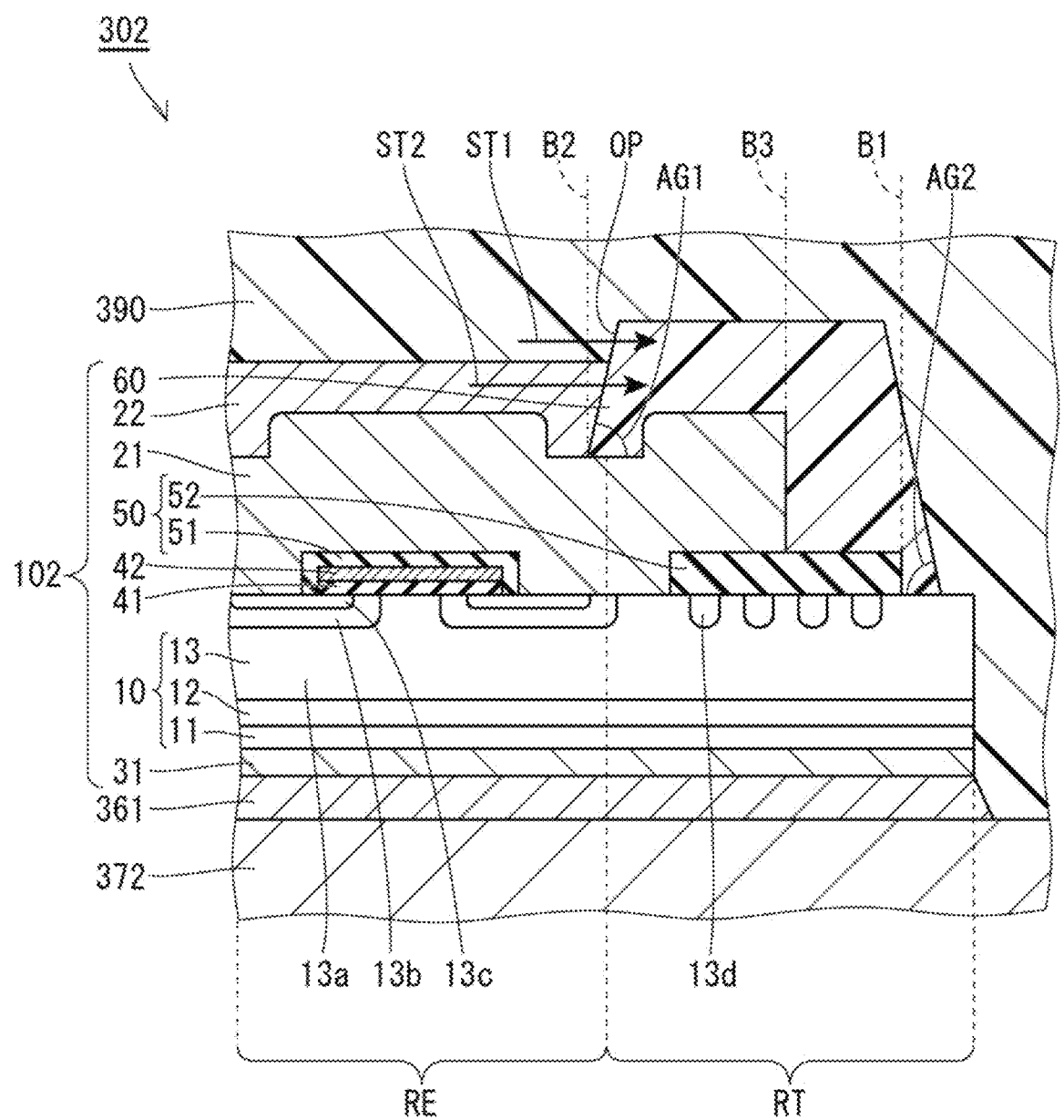
FIG. 16 is a partial cross-sectional view schematically showing a portion of FIG. 15.
Figure 17:
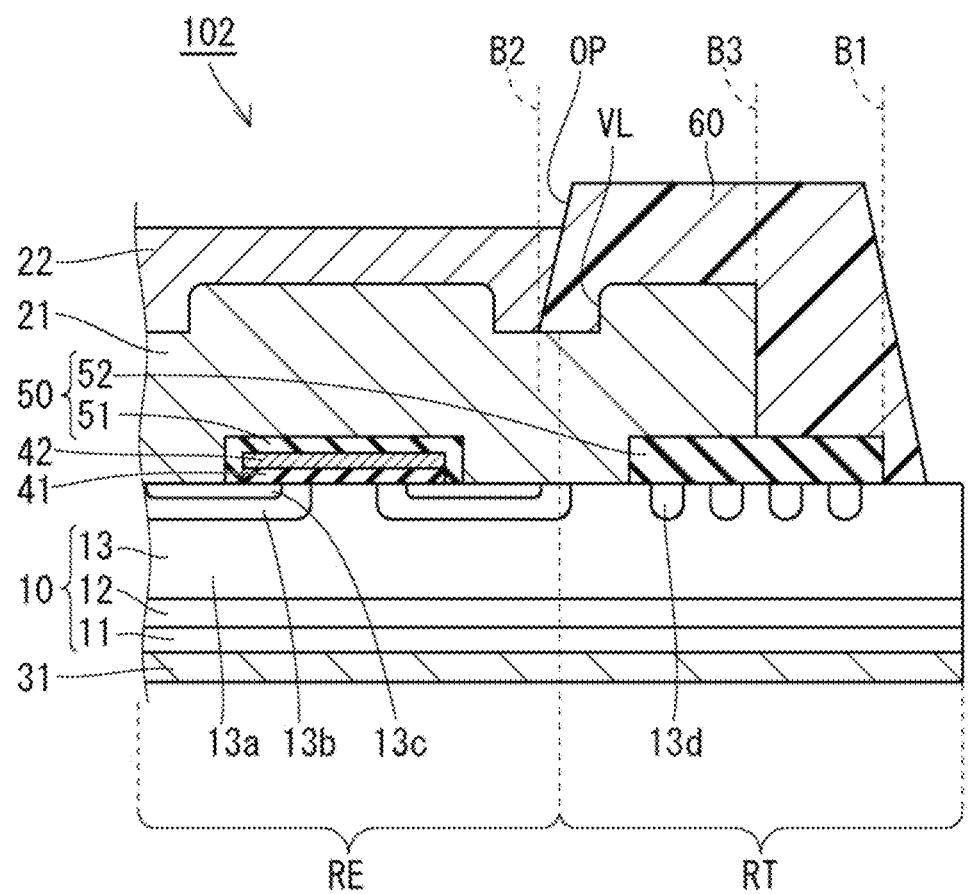
FIG. 17 is a partial cross-sectional view schematically showing a configuration of a power semiconductor element (power semiconductor device) included in the power module of FIG. 15.

FIG. 15 is a cross-sectional view schematically showing a configuration of a power module 302 (power semiconductor device) in Embodiment 2. FIG. 16 is a partial cross-sectional view schematically showing a portion of FIG. 15. FIG. 17 is a partial cross-sectional view schematically showing a configuration of a power semiconductor element 102 (power semiconductor device) included in the power module 302.

The power semiconductor element 102 (FIG. 17) includes a metal layer 22 on the source electrode 21. The metal layer 22 has an outer end surface (a right side surface of the metal layer 22 in each of FIGS. 16 and 17). The outer end surface and an inner end surface of the insulating protective film 60 (a left side surface of the insulating protective film 60 in each of FIGS. 16 and 17) oppose each other. The outer end surface of the metal layer 22 and the inner end surface of the insulating protective film 60 are in contact with each other in the present embodiment. Specifically, the metal layer 22 is in contact with the inner edge B2 of the insulating protective film 60. Furthermore, in the present embodiment, the outer end surface of the metal layer 22 as a whole may be in contact with the inner end surface of the insulating protective film 60 as shown in each of FIGS. 16 and 17. The metal layer 22 partially fills a space formed by the openings OP of the insulating protective film 60. The metal layer 22 is preferably disposed only inside the openings OP of the insulating protective film 60. The metal layer 22 is preferably a plated layer. For example, the source electrode 21 is made of aluminum or an aluminum alloy, and the metal layer 22 is made of at least one of nickel and copper. The insulating protective film 60 preferably protrudes beyond the metal layer 22 in the thickness direction (a vertical direction in FIG. 17). Relative to an in-plane direction (a horizontal direction in FIG. 16), the side surface of the insulating protective film 60 has an angle AG1 at the inner edge B2, and has an angle AG2 at the outer edge. The angle AG1 is preferably less than 90°, more preferably 60° or less, and even more preferably 45° or less. The angle AG1 and the angle AG2 are typically substantially the same. The other configuration is substantially the same as that of the above-mentioned power semiconductor element 101 (FIG. 7: Embodiment 1), so that the same or corresponding components bear the same reference signs, and description thereof will be not repeated.

The power module 302 includes a solder layer 351 (FIG. 15). The solder layer 351 connects the lead frame 371 and the metal layer 22 (FIG. 16). The sealing member 390 (FIG. 16) covers the source electrode 21 of the power semiconductor element 102 through the metal layer 22. Thus, in the power module 302, the lead frames are connected to an upper surface and a lower surface of the power semiconductor element 102 through the solder layers. The other configuration is substantially the same as that of the above-mentioned power module 301 (FIGS. 1 and 2: Embodiment 1), so that the same or corresponding components bear the same reference signs, and description thereof will be not repeated.

Manufacturing Method

Figure 18:
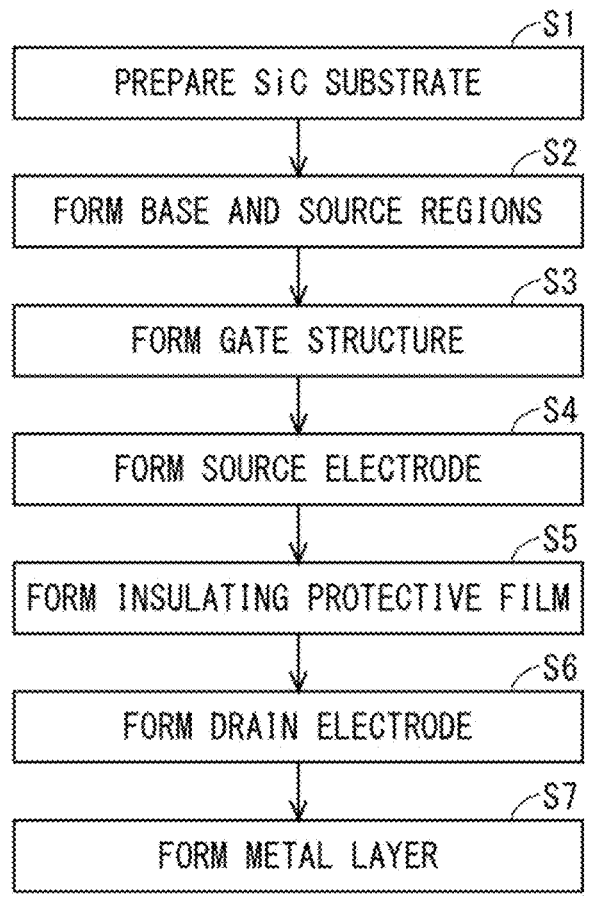
FIG. 18 is a flowchart schematically showing a method of manufacturing the power semiconductor element (power semiconductor device) in Embodiment 2 of the present invention.

FIG. 18 is a flowchart schematically showing a method of manufacturing the power semiconductor element 102 in Embodiment 2. Steps similar to those in Embodiment 1 (FIG. 8) may be performed before and in step S6. In Embodiment 2, the metal layer 22 is formed on the source electrode 21 in step S7 (FIG. 18). A case where plating is used in the step will be described in detail below.

First, the surface of the source electrode 21 is cleaned by plasma cleaning or sputtering. Organic residues on the source electrode 21 are thus removed by oxidative decomposition by plasma or sputtering. Next, the surface of the source electrode 21 is etched by degreasing through acid cleaning and the like. The surface of the source electrode 21 is thereby roughened to increase reactivity to a process liquid in a subsequent step. Next, the surface is zincated. Specifically, a zinc coating is formed while a surface oxide film of the source electrode 21 is removed.

Next, electroless Ni plating is performed on the coating. Specifically, the surface (e.g., an Al alloy coating covered with Zn) of the surface of the source electrode 21 is first immersed in an electroless Ni plating solution. Zn is less noble than Ni due to its lower standard redox potential, so that Ni is deposited on the Al alloy. Once the surface is thereby covered with Ni, Ni is autocatalytically deposited by the action of a reducing agent contained in the plating solution. A component of the reducing agent, however, is incorporated into the plated layer at the autocatalytic deposition, so that an electroless Ni plated coating becomes an alloy and, when the reducing agent has a high concentration, becomes amorphous. Hypophosphorous acid is typically used as the reducing agent, so that the electroless Ni plating contains P. The thickness of the electroless Ni plating is preferably 1 μm or more, more preferably 3 μm or more, and is approximately 5 μm, for example.

Substitutional electroless Au plating is performed on the above-mentioned electroless Ni plated layer. It is difficult to increase the thickness of the substitutional electroless Au plating to more than 0.1 μm, and the substitutional electroless Au plating typically has a thickness of approximately 0.05 μm, but the thickness is sufficient for the substitutional electroless Au plating as a layer underlying the solder layer 351.

The power semiconductor element 102 is thereby obtained. To obtain the power module 302 from the power semiconductor element 102 thus manufactured, the lead frame 371 and the lead frame 372 are first connected to the upper surface and the lower surface of the power semiconductor element 102 through the solder layer 351 and the solder layer 361. The sealing member 390 is then formed by sealing using a mold resin.

Experimental Result

Figure 19:
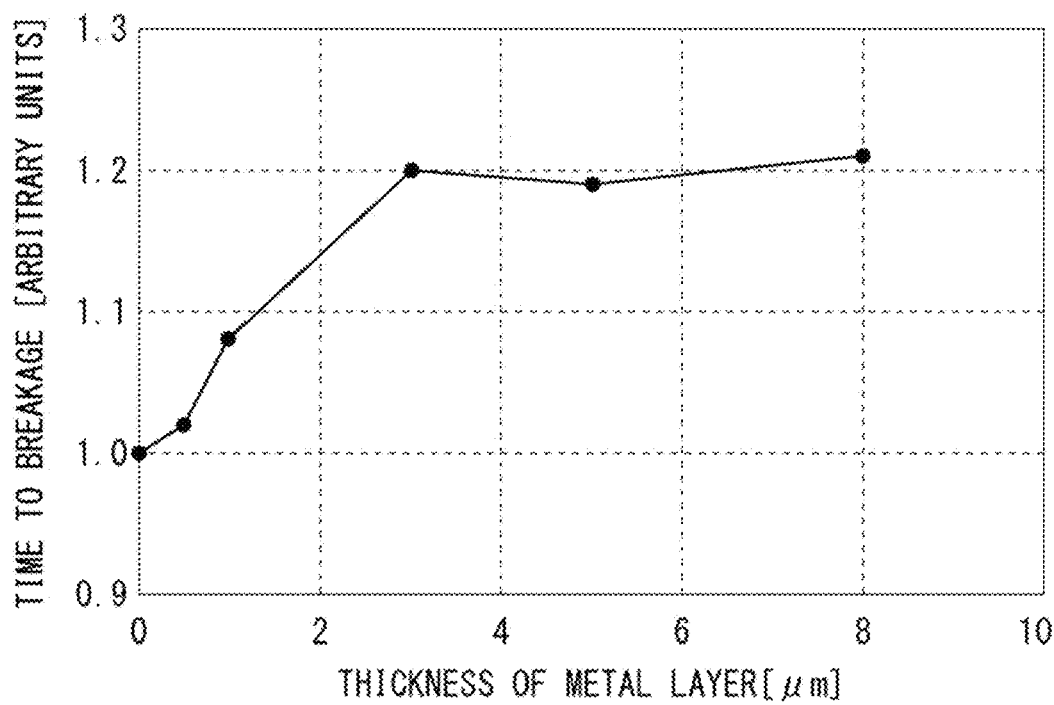
FIG. 19 is a graph showing an experimental result of a relationship between the thickness of a metal layer of the power semiconductor element of the power module shown in FIG. 16 and time to breakage of the power semiconductor element at a short circuit.

FIG. 19 is a graph showing an experimental result of a relationship between the thickness of the metal layer 22 of the power semiconductor element 102 of the power module 302 (FIG. 16) and time to breakage of the power semiconductor element 102 at a short circuit. It was found, from the result, that the thickness of the metal layer 22 was preferably 1 μm or more, and more preferably 3 μm or more to extend the time to breakage.

Effects

According to the present embodiment, the time to breakage of the power semiconductor element 102 at the short circuit can be extended by heat capacity of the metal layer 22 on the source electrode 21. Resistance to a momentary short circuit is thereby enhanced. Even in a case of a continuous short circuit, if the time to breakage is sufficiently long, time for a circuit connected to the power semiconductor element 102 to perform protective operation can be secured. A failure of the power semiconductor element 102 can thereby be suppressed.

The metal layer 22 is preferably a plated layer. The metal layer 22 can thereby be formed at a higher deposition rate compared with vacuum deposition, such as vapor deposition and sputtering. The metal layer 22 can thereby be formed with a high productivity even if the metal layer 22 has a large thickness.

The metal layer 22 has an outer edge being in contact with the inner edge B2 of the insulating protective film 60. In contrast to the source electrode 21, the metal layer 22 thus does not elevate an uppermost portion of the insulating protective film 60. An aspect ratio of the insulating protective film 60 can thereby be suppressed compared with a case where the thickness of the source electrode 21 is simply increased to increase the heat capacity. Reduction in strength of the insulating protective film 60 due to an increase in aspect ratio is thereby avoided. Breakage of the insulating protective film 60 can thus more reliably be prevented.

The metal layer 22 partially fills the space formed by the openings OP of the insulating protective film 60. Stress ST1 (FIG. 16) applied from the sealing member 390 to the insulating protective film 60 is thereby reduced compared with the stress ST (FIG. 2) in a case of Embodiment 1. Breakage of the insulating protective film 60 can thus more reliably be prevented.

The radius of curvature R2 is greater than the radius of curvature R1 (see FIG. 6), so that breakage of the insulating protective film 60 due to stress ST2 (FIG. 16) from the metal layer 22 is suppressed for a similar reason to that for suppressing breakage of the insulating protective film 60 due to the stress ST (FIG. 2: Embodiment 1) from the sealing member 390.

The angle AG1 of the insulating protective film is preferably 60° or less, and more preferably 45° or less. In this case, the above-mentioned stress ST2 can be reduced.

By using a material suitable for soldering as a material for the metal layer 22, the lead frame 371 can be joined to the power semiconductor element 102 not by the bonding wire 350 but by the solder layer 351. Junction resistance can thereby be reduced. By providing the solder layer 351 and the lead frame 371, the heat capacity of the solder layer and the lead frame is added to each of the upper surface and the lower surface of the power semiconductor element 102. The time to breakage of the power semiconductor element 102 at the short circuit can thereby be further extended.

The radius of curvature R2 is greater than the radius of curvature R1 (see FIG. 6), so that the puddle is less likely to be formed in the vicinity of the curved portion of the inner edge B2 of the insulating protective film 60 in plating in the openings OP of the insulating protective film 60 at the manufacture. Abnormal appearance due to local oxidation in the puddle can thereby be mitigated. From this point of view, the radius of curvature R2 is preferably at least 1.5 times the radius of curvature R1 according to the experiment conducted by the present inventors.

The insulating protective film 60 preferably protrudes beyond the metal layer 22 in the thickness direction (vertical direction in FIG. 17). Melted solder is thus less likely to leak outside the openings OP of the insulating protective film 60 when the solder layer 351 (FIG. 15) is formed on the metal layer 22. Excessive spread of the solder layer 351 is thereby prevented.

Embodiment 3

Figure 20:
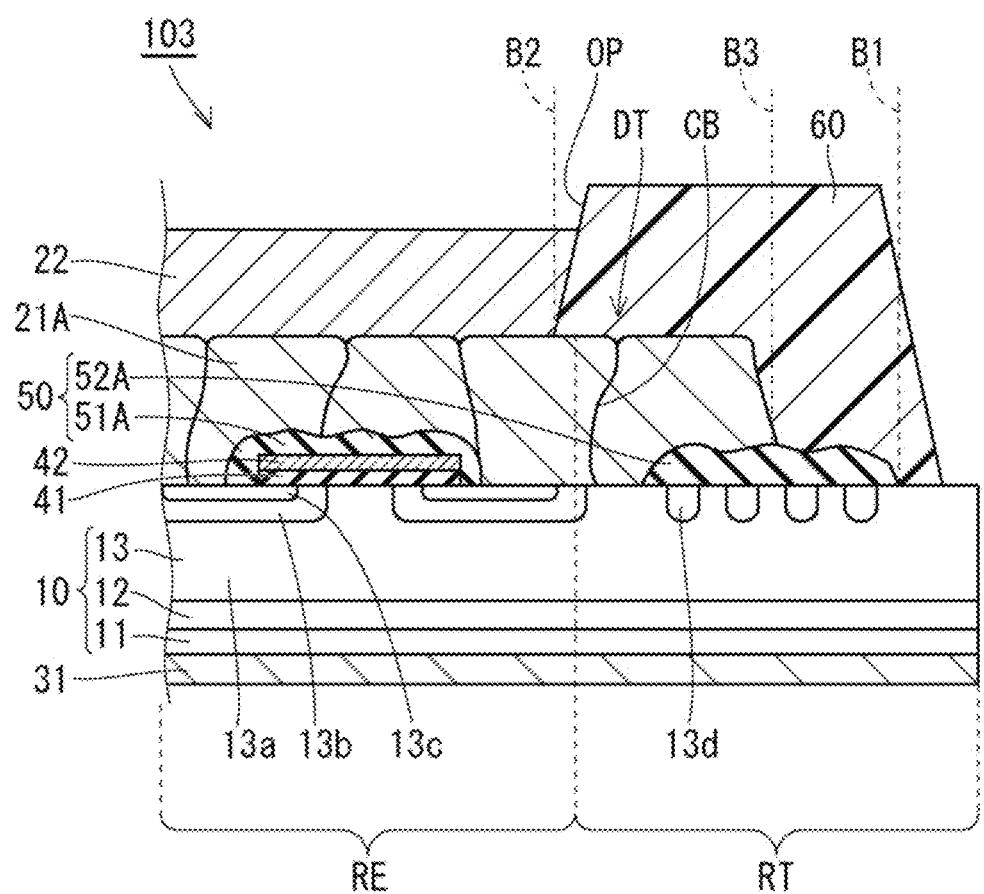
FIG. 20 is a partial cross-sectional view schematically showing a configuration of a power semiconductor element (power semiconductor device) in Embodiment 3 of the present invention.

FIG. 20 is a partial cross-sectional view schematically showing a configuration of a power semiconductor element 103 (power semiconductor device) in Embodiment 3. In the present embodiment, an interlayer insulating film 51A and an interlayer insulating film 52A are provided in place of the interlayer insulating film 51 and the interlayer insulating film 52 (FIG. 7). The interlayer insulating film 51A and the interlayer insulating film 52A contain silicon, boron, and phosphorus. The interlayer insulating film 51A and the interlayer insulating film 52A preferably contain glass made of the above-mentioned materials, that is, boro-phospho silicate glass (BPSG), and may be made of BPSG. A source electrode 21A has grain boundaries, and has a surface having depressions DT located at the grain boundaries CB.

An example of a method of manufacturing the power semiconductor element 103 will be described next. Steps before and in the step shown in FIG. 10 are first performed as in Embodiment 1. Next, the interlayer insulating film 51A and the interlayer insulating film 52A are formed using silicate glass containing approximately 1.5 to 3.5 weight percent of boron and approximately 6.0 to 9.0 mol % of phosphorus. Next, the source electrode 21A is formed as in Embodiment 1. The source electrode 21A is then heat treated. The source electrode 21 is thereby provided with the above-mentioned structure. The temperature of the heat treatment is preferably 400° C. or more. Similar steps to those in Embodiment 1 are then performed to yield the power semiconductor element 103. The source electrode 21A is preferably heat treated after deposition of the source electrode 21A and before formation of the insulating protective film 60.

According to the manufacturing method as described above, the interlayer insulating film 52A can have a greater surface roughness than the semiconductor layer 13, and the source electrode 21A can have a greater surface roughness than the interlayer insulating film 52A. Since the interlayer insulating film 52A has a greater surface roughness, adhesion between the interlayer insulating film 52A and the insulating protective film 60 is increased. Since the source electrode 21A has a greater surface roughness, adhesion between the source electrode 21A and the insulating protective film 60 is increased. Detachment of the insulating protective film 60 due to the thermal cycling is thereby suppressed.

The surface roughness may be calculated from an interface appearing in an optical micrograph in a field of view corresponding to FIG. 20. A range of measurement of the surface roughness is selected so as not to be affected by unevenness due to a combination of members of the power semiconductor element 103. For example, a value of the surface roughness is not allowed to reflect a step on the surface of the source electrode 21A due to the presence of the MOS gate structure. For this reason, the surface roughness of the source electrode 21A may be measured only over a region in which the MOS gate structure is not provided, for example. A reference length when the surface roughness is calculated depends on the size of the above-mentioned range of measurement, and is approximately 10 μm, for example. When the semiconductor layer has the trench structure, the range of measurement of the surface roughness is selected so as not to be affected by the trench structure.

Effects

According to the present embodiment, the interlayer insulating film 52 contains silicon, boron, and phosphorus. A change in thickness at the edge of the interlayer insulating film 52 is thus likely to be smooth. Disturbance in shape of the film covering the interlayer insulating film 52 in the vicinity of the edge of the interlayer insulating film 52 can thereby be suppressed. Detachment of the film covering the interlayer insulating film 52 in the vicinity of the edge of the interlayer insulating film 52 can thereby be suppressed. In particular, detachment of the insulating protective film 60 in the vicinity of the outer edge of the interlayer insulating film 52 can be suppressed.

On the other hand, the edge of the interlayer insulating film 52 becomes smooth as described above, so that a step VL (FIGS. 7 and 17: Embodiment 1 and Embodiment 2) on the source electrode 21 due to the edge is substantially eliminated. As a result, an anchoring effect between the source electrode 21 and the insulating protective film 60 produced by the step VL almost disappears. This leads to reduction in adhesion between the source electrode 21 and the insulating protective film 60, but, according to the present embodiment, the reduction is offset for the following reason.

The source electrode 21 has the surface having the depressions DT located at the grain boundaries CB. Due to the presence of the depressions DT, the source electrode 21 can have a sufficiently large surface roughness. Adhesion between the source electrode 21 and the insulating protective film 60 can thereby be increased.

Embodiment 4

Configuration

Figure 21:
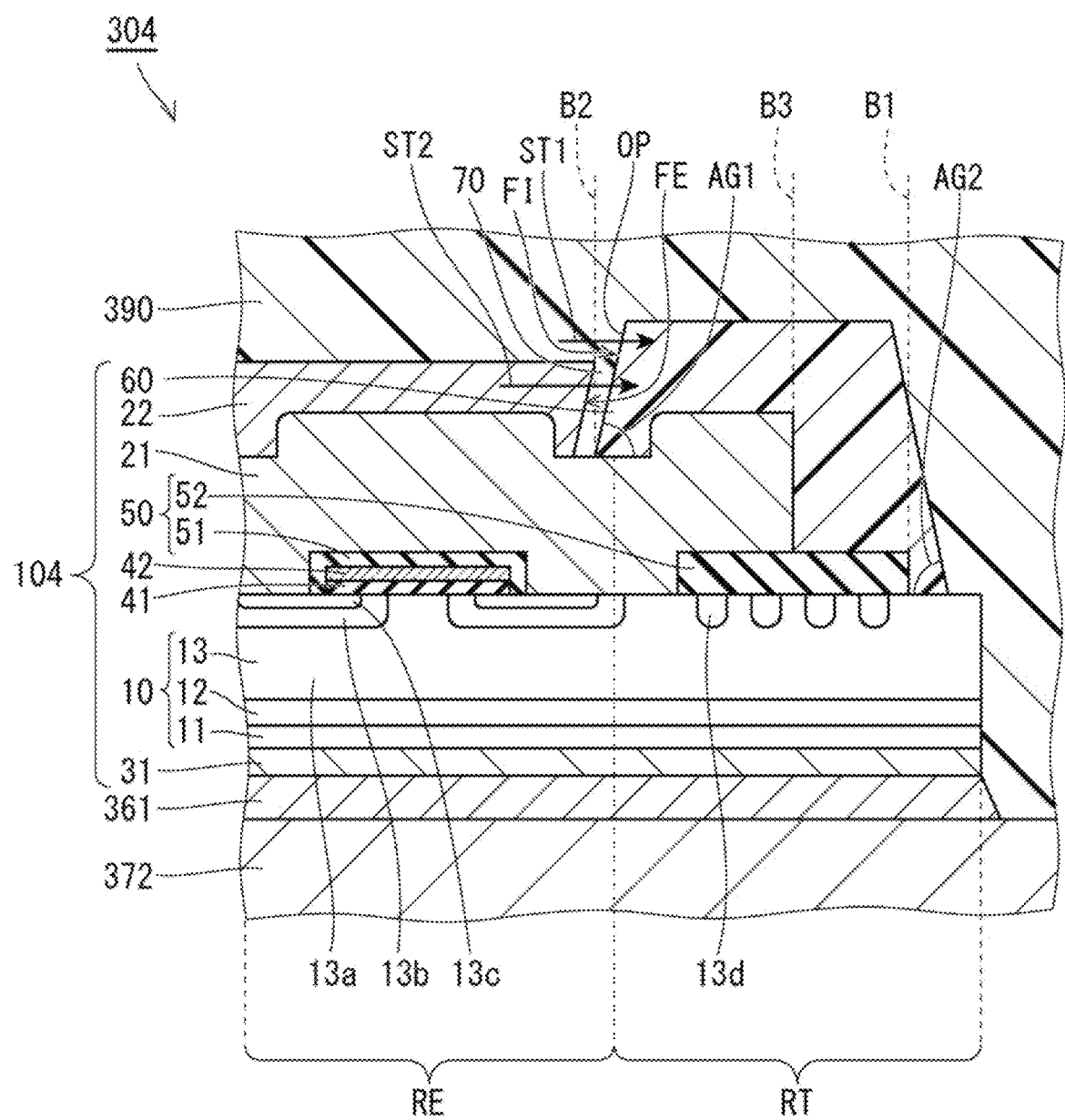
FIG. 21 is a partial cross-sectional view schematically showing a configuration of a power module (power semiconductor device) in Embodiment 4 of the present invention in a similar field of view to that of FIG. 16.
Figure 22:
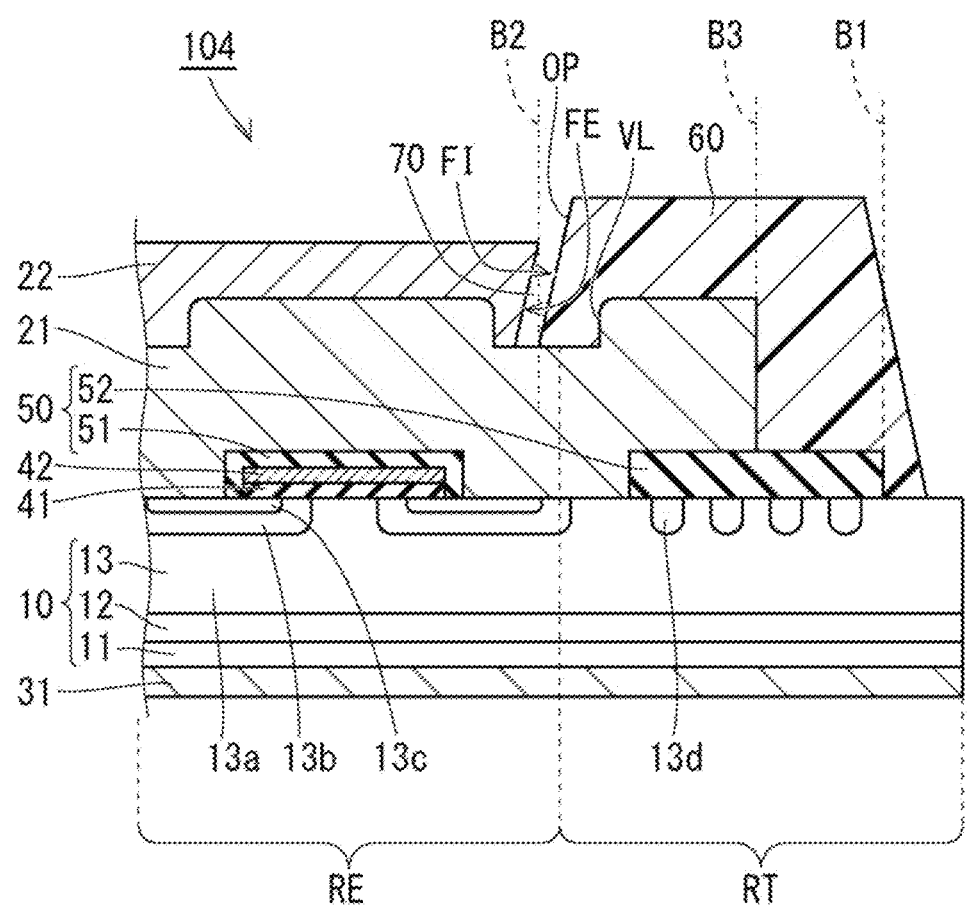
FIG. 22 is a partial cross-sectional view schematically showing a configuration of a power semiconductor element (power semiconductor device) included in the power module of FIG. 21.

FIG. 21 is a partial cross-sectional view schematically showing a configuration of a power module 304 (power semiconductor device) in Embodiment 4 in a similar field of view to that of FIG. 16 (Embodiment 2). FIG. 22 is a partial cross-sectional view schematically showing a configuration of a power semiconductor element 104 (power semiconductor device) included in the power module 304 (FIG. 21).

The metal layer 22 has an outer end surface FE. The insulating protective film 60 has an inner end surface FI opposing the outer end surface FE of the metal layer 22. In the present embodiment, the inner end surface FI of the insulating protective film 60 and the outer end surface FE of the metal layer 22 oppose each other with a gap 70 therebetween. The gap 70 at least partially separates the inner end surface FI of the insulating protective film 60 and the outer end surface FE of the metal layer 22, and, in an example shown in FIGS. 21 and 22, the gap 70 completely separates the inner end surface FI of the insulating protective film 60 and the outer end surface FE of the metal layer 22. The gap 70 is herein a space separating the inner end surface FI of the insulating protective film 60 and the outer end surface FE of the metal layer 22 by a small distance, and the small distance is 0.01 μm or more and 10 μm or less, for example.

The other configuration is substantially the same as that of the above-mentioned power semiconductor element 102 (FIG. 17: Embodiment 2), so that the same or corresponding components bear the same reference signs, and description thereof will be not repeated.

Manufacturing Method

Steps similar to those in Embodiment 2 may be performed before and in step S6 (FIG. 18). In the present embodiment, processing described below is performed in step S7 (FIG. 18).

First, the surface of the source electrode 21 is cleaned by plasma cleaning or sputtering as in Embodiment 2. Organic residues on the source electrode 21 are thus removed by oxidative decomposition by plasma or sputtering Next, the surface is zincated to form a zinc coating. An electroless Ni plated layer is formed by electroless plating on the coating. Substitutional electroless Au plating is performed on the electroless Ni plated layer. As described above, the metal layer 22 is formed by plating. In this case, the metal layer 22 can be formed at a higher deposition rate compared with vapor deposition or sputtering. The metal layer 22 can thereby be formed with a high productivity even if the metal layer 22 has a large thickness. If such productivity does not have any problem, another method, such as vapor deposition and sputtering, may be applied.

Next, a plating solution is removed by cleaning. A liquid (e.g., pure water) used in cleaning is then removed by spin drying and the like.

Next, heating is performed using a bake furnace, for example. The gap 70 is thereby formed between the metal layer 22 provided on the source electrode 21 and the insulating protective film 60. If the temperature of the heating is too low, the gap 70 might not be formed at all, or might be formed only insufficiently. The temperature of the heating is thus preferably 60° C. or more, and more preferably 80° C. or more. On the other hand, if the temperature of the heating is too high, solder wettability of the metal layer 22 might be excessively reduced due to oxidation of the surface. Furthermore, if the temperature of the heating is too high, the gap 70 might be formed excessively. The temperature of the heating is thus preferably 250° C. or less, and more preferably 150° C. or less.

Figure 23:
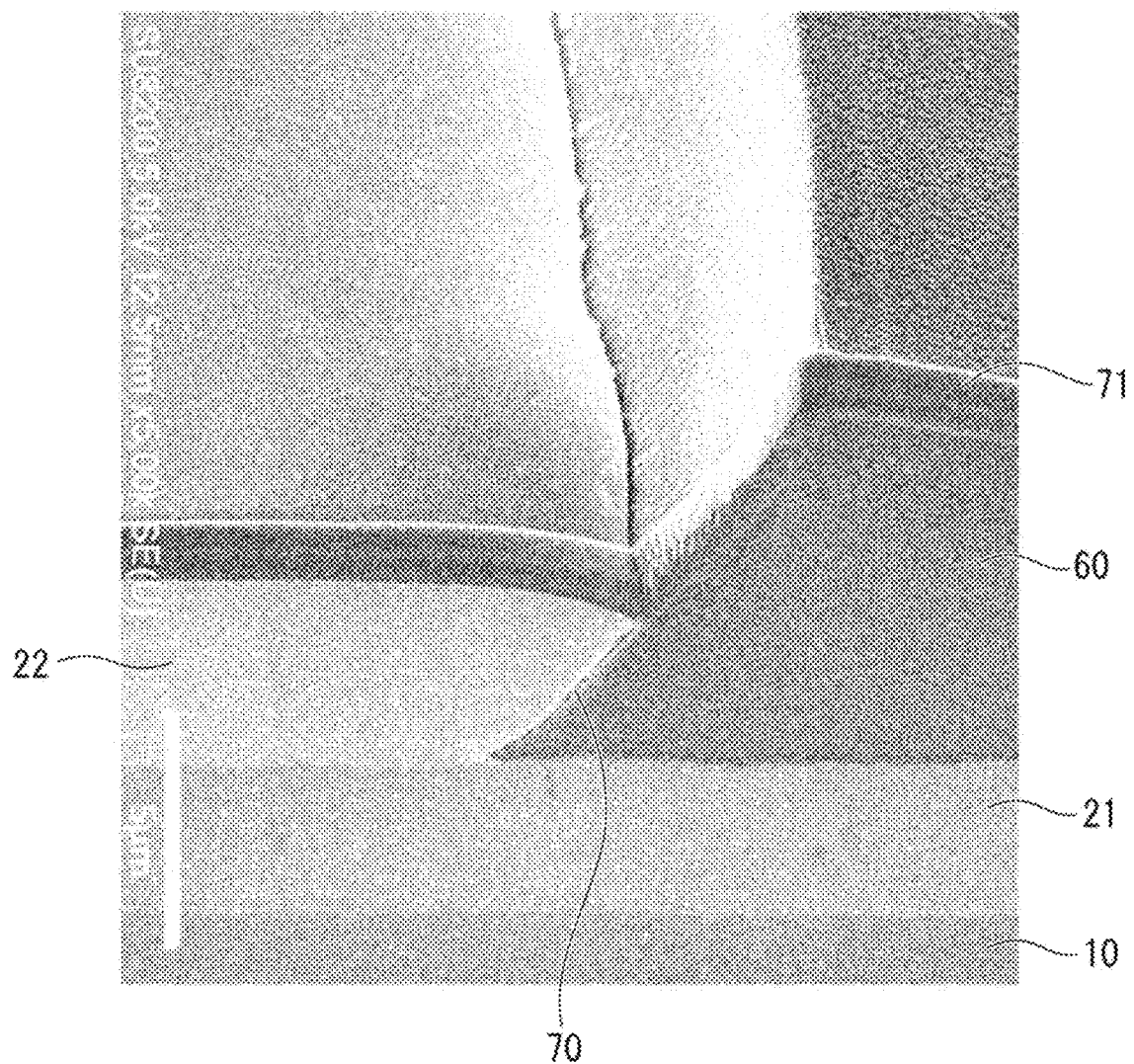
FIG. 23 is an electron micrograph showing a portion of FIG. 22.

FIG. 23 is an electron micrograph showing a portion of FIG. 22. In FIG. 23, a film 71 is formed for convenience of electronmicroscopy, and is not a component of the power semiconductor element.

Effects

According to the present embodiment, the gap 70 is provided between the metal layer 22 and the insulating protective film 60. The effect of reducing the stress ST2 described above in Embodiment 2 with reference to FIG. 16 can thereby significantly be increased. Breakage of the insulating protective film 60 can thereby be further suppressed.

Embodiment 5

Figure 24:
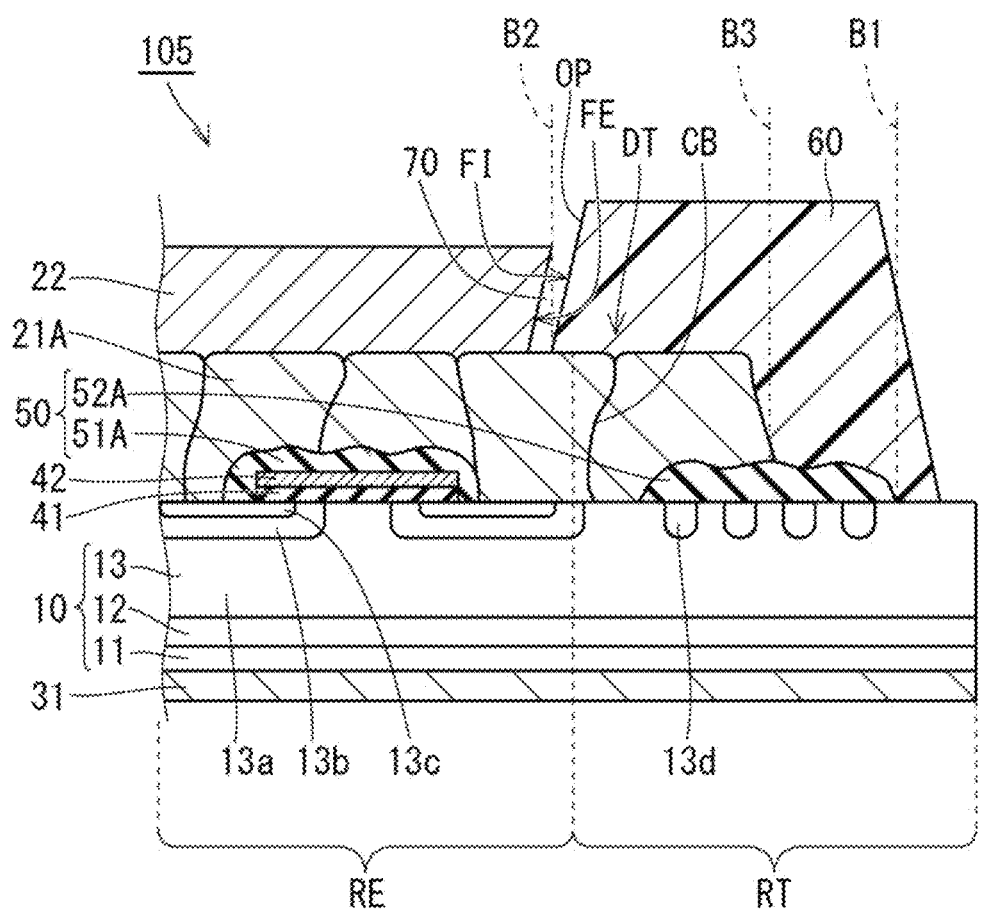
FIG. 24 is a partial cross-sectional view schematically showing a configuration of a power semiconductor element (power semiconductor device) in Embodiment 5 of the present invention in a similar field of view to that of FIG. 22.

FIG. 24 is a partial cross-sectional view schematically showing a configuration of a power semiconductor element 105 (power semiconductor device) in Embodiment 5 in a similar field of view to that of FIG. 22.

In the present embodiment, the interlayer insulating films 51A and 52A (FIG. 20: Embodiment 3) are used in place of the interlayer insulating film 50 (FIG. 22: Embodiment 4). The source electrode 21A (FIG. 20: Embodiment 3) is also used in place of the source electrode 21 (FIG. 22: Embodiment 4).

The other configuration is substantially the same as that of the above-mentioned power semiconductor element 104 (FIG. 22: Embodiment 4), so that the same or corresponding components bear the same reference signs, and description thereof will be not repeated. The power semiconductor element 105 in the present embodiment can form a power module substantially similarly to the power semiconductor element 104 (FIG. 21: Embodiment 4) forming the power module 304.

Embodiment 6

Figure 25:
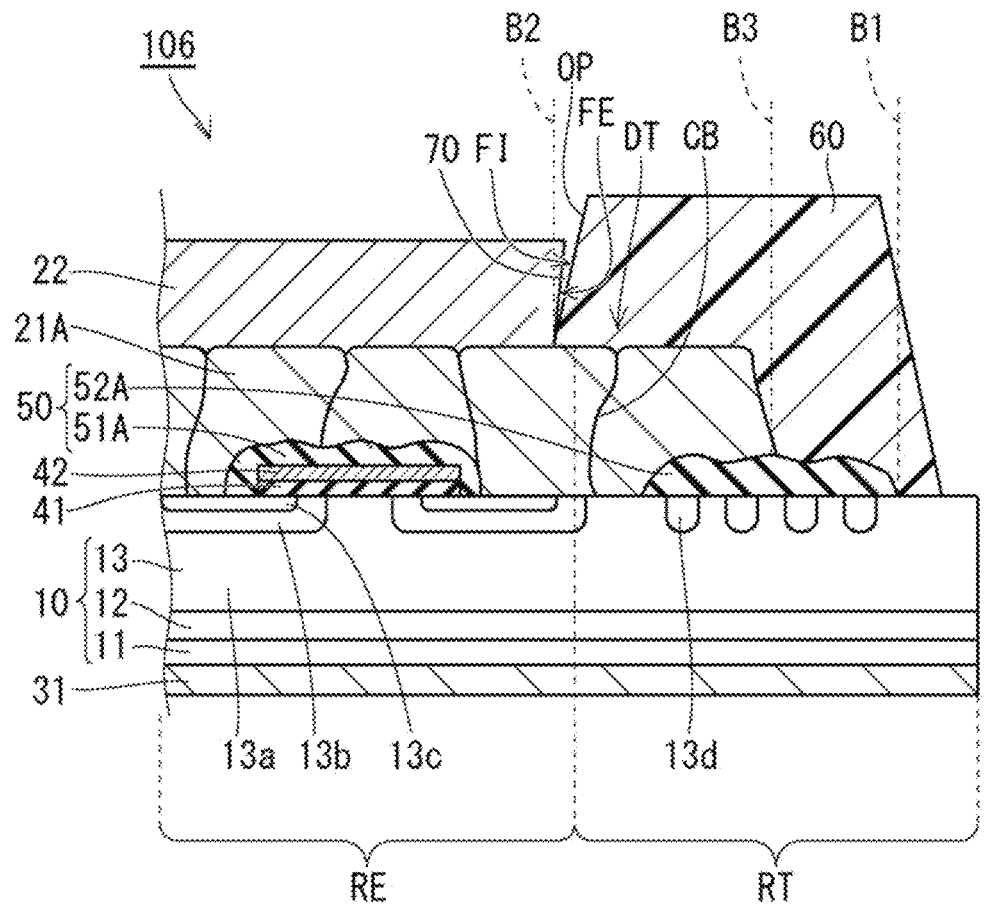
FIG. 25 is a partial cross-sectional view schematically showing a configuration of a power semiconductor element (power semiconductor device) in Embodiment 6 of the present invention in a similar field of view to that of FIG. 24.

FIG. 25 is a partial cross-sectional view schematically showing a configuration of a power semiconductor element 106 (power semiconductor device) in Embodiment 6 in a similar field of view to that of FIG. 24. In the present embodiment, the inner end surface FI of the insulating protective film 60 and the outer end surface FE of the metal layer 22 are partially in contact with each other. The gap 70 thus only partially separates the inner end surface FI of the insulating protective film 60 and the outer end surface FE of the metal layer 22. It is preferable that 50% or more of the outer end surface FE of the metal layer 22 in the thickness direction (a vertical direction in FIG. 25) face the gap 70. It is more preferable that the gap 70 do not reach the surface (an upper surface in FIG. 25) of the source electrode 21A, and be away from the surface as shown in FIG. 25. In this case, the metal layer 22 and the insulating protective film 60 are in contact with each other on the source electrode 21A.

The other configuration is substantially the same as that of the above-mentioned power semiconductor element 105 (FIG. 24: Embodiment 5), so that the same or corresponding components bear the same reference signs, and description thereof will be not repeated. The feature of the metal layer 22 and the insulating protective film 60 being in contact with each other while forming the gap 70 as in Embodiment 6 (FIG. 25) may be applied to the power semiconductor element 104 in Embodiment 4 (FIG. 22). The power semiconductor element 106 in the present embodiment can form a power module substantially similarly to the power semiconductor element 104 (FIG. 21: Embodiment 4) forming the power module 304.

According to the present embodiment, the inner end surface FI of the insulating protective film 60 and the outer end surface FE of the metal layer 22 are in contact with each other. Such a contact portion suppresses ingress of moisture from an external environment into the surface of the source electrode 21A. Corrosion of the source electrode 21A is thereby suppressed. Reliability of the power semiconductor element 106 can thereby be improved.

In particular, when the metal layer 22 and the insulating protective film 60 are in contact with each other on the source electrode 21A as shown in FIG. 25, the surface of the source electrode 21A is covered between the metal layer 22 and the insulating protective film 60. Corrosion of the source electrode 21A due to ingress of moisture is thereby further suppressed. Reliability of the power semiconductor element 106 can thereby be further improved.

Embodiment 7

In Embodiment 7, a power converter to which the power module (power semiconductor device) according to any of Embodiments 1 to 6 described above has been applied will be described. The application is not limited to application to a particular power converter, but a three-phase inverter will be described in detail below as the power converter.

Figure 26:
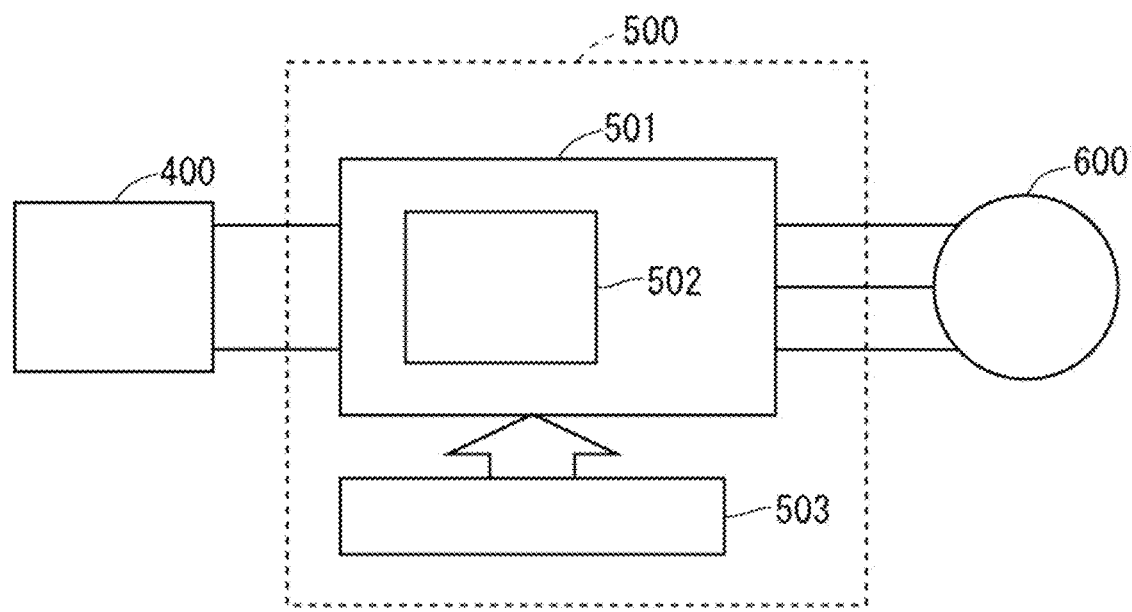
FIG. 26 is a block diagram schematically showing a configuration of a power conversion system to which a power converter in Embodiment 7 of the present invention has been applied.

FIG. 26 is a block diagram schematically showing a configuration of a power conversion system to which a power converter 500 in Embodiment 7 has been applied. The power conversion system includes a power supply 400, the power converter 500, and a load 600.

The power supply 400 is a DC power supply, and supplies DC power to the power converter 500. The power supply 400 can be configured in various forms, and, for example, can be configured by a DC system, a solar cell, or a storage battery, and also can be configured by a rectifier circuit or an AC/DC converter connected to an AC system. The power supply 400 may be configured by a DC/DC converter to convert DC power output from the DC system into predetermined power.

The power converter 500 is the three-phase inverter connected between the power supply 400 and the load 600. The power converter 500 converts the DC power supplied from the power supply 400 into AC power, and supplies the AC power to the load 600. The power converter 500 includes a main conversion circuit 501 to convert the DC power into the AC power for output and a control circuit 503 to output, to the main conversion circuit, a control signal to control the main conversion circuit 501.

The load 600 is a three-phase motor driven by the AC power supplied from the power converter 500. The motor is not limited to that for a particular application, and may be mounted on various types of electrical equipment. The motor is for hybrid vehicles, electric vehicles, railroad vehicles, elevators, or air-conditioning equipment, for example.

The power converter 500 will be described in detail below. The main conversion circuit 501 includes switching elements and freewheeling diodes (not shown). By switching of the switching elements, the DC power supplied from the power supply 400 is converted into the AC power, and is supplied to the load 600. The main conversion circuit 501 can have various specific circuit configurations, and the main conversion circuit 501 in Embodiment 7 is a two-level three-phase full-bridge circuit, and can include six switching elements and six freewheeling diodes connected in antiparallel with the respective switching elements. At least any of the switching elements and the freewheeling diodes of the main conversion circuit 501 is configured by a semiconductor module 502 corresponding to that in any of Embodiments 1 to 6 described above. Every two switching elements out of the six switching elements are connected in series with each other to constitute three pairs of upper and lower arms. The upper and lower arms constitute respective phases (a U phase, a V phase, and a W phase) of the full-bridge circuit. Output terminals of the respective upper and lower arms, that is, three output terminals of the main conversion circuit 501 are connected to the load 600.

The main conversion circuit 501 includes a drive circuit (not shown) to drive each of the switching elements of the main conversion circuit 501. The drive circuit may be incorporated in the semiconductor module 502, or may be provided in the main conversion circuit 501 separately from the semiconductor module 502. The drive circuit generates a drive signal to drive the switching elements, and supplies the drive signal to a control electrode of each of the switching elements. Specifically, the drive circuit outputs, to the control electrode of each of the switching elements, a drive signal to switch the switching element to an on state and a drive signal to switch the switching element to an off state in accordance with the control signal from the control circuit 503, which will be described below. The drive signal is a voltage signal (an on signal) equal to or greater than a threshold voltage of the switching element when the switching element is maintained in the on state, and is a voltage signal (an off signal) smaller than the threshold voltage of the switching element when the switching element is maintained in the off state.

The control circuit 503 controls the switching elements of the main conversion circuit 501 so that desired power is supplied to the load 600. Specifically, time (on time) during which each of the switching elements of the main conversion circuit 501 is to be in the on state is calculated based on power to be supplied to the load 600. For example, the main conversion circuit 501 can be controlled through pulse width modulation (PWM) control to modulate the on time of each of the switching elements in accordance with a voltage to be output. A control command (the control signal) is output to the drive circuit of the main conversion circuit 501 so that the on signal is output to a switching element to be in the on state, and the off signal is output to a switching element to be in the off state at each time point. The drive circuit outputs, as the drive signal, the on signal or the off signal to the control electrode of each of the switching elements in accordance with the control signal.

According to the power converter 500 in Embodiment 7, the semiconductor module according to any of Embodiments 1 to 6 is applied to at least any of the switching elements and the freewheeling diodes of the main conversion circuit 501. Reliability of the power converter 500 can thereby be improved.

The two-level three-phase inverter has been described in detail as the power converter in Embodiment 7 above, but the power converter is not limited to the two-level three-phase inverter. For example, the power converter may be a three-level or multi-level inverter in place of the two-level inverter. The number of phases of the power converter is not limited to three, and the power converter may be a single-phase power converter. The load may be operated not by the AC power but by the DC power, and, in this case, the power converter may be a DC/DC converter or an AC/DC converter. The load is not limited to the motor, and may be an electrical discharge machine, a laser machine, an induction cooker, or a noncontact power supply system, for example. The power converter can also be used as a power conditioner of a photovoltaic system, a storage system, and the like.

Embodiments of the present invention can freely be combined with each other, and can be modified or omitted as appropriate within the scope of the invention. While the invention has been described in detail, the foregoing description is in all aspects illustrative and not restrictive. It is therefore understood that numerous modifications not having been described can be devised without departing from the scope of the invention.

EXPLANATION OF REFERENCE SIGNS

CB grain boundary, CN corner, RE element region, OP opening, RT termination region, 10 SiC substrate (semiconductor substrate), 21, 21A source electrode (electrode), 22 metal layer, 31 drain electrode, 40 temperature sense diode, 41 gate insulating film, 42 gate electrode, 50, 51, 51A, 52, 52A interlayer insulating film, 60 insulating protective film, 70 gap, 92 gate pad electrode, 93 sense pad electrode, 93a anode pad electrode, 93c cathode pad electrode, 101 to 106 power semiconductor element, 301, 302, 304 power module, 350 bonding wire, 351, 361 solder layer, 371, 372 lead frame, 390 sealing member, 400 power supply, 500 power converter, 501 main conversion circuit, 502 semiconductor module, 503 control circuit, 600 load.

The invention claimed is:

1. A power semiconductor device including a termination region having a corner and an element region inside the termination region, the power semiconductor device comprising:
a semiconductor substrate spanning the element region and the termination region;
an interlayer insulating film having an outer edge on the semiconductor substrate in the termination region;
an electrode being in contact with the semiconductor substrate in the element region, and having an outer edge on the interlayer insulating film in the termination region such that at least a portion of the interlayer insulating film is disposed between the semiconductor substrate and the outer edge of the electrode; and
an insulating protective film covering the outer edge of the interlayer insulating film and the outer edge of the electrode, and having an inner edge on the electrode, wherein
at the corner of the termination region, the outer edge of the interlayer insulating film has a radius of curvature R1, and the inner edge of the insulating protective film has a radius of curvature R2, the radius of curvature R2 being greater than the radius of curvature R1.

2. The power semiconductor device according to claim 1, wherein
the insulating protective film comprises organic matter.

3. The power semiconductor device according to claim 1, wherein
the interlayer insulating film comprises inorganic matter.

4. The power semiconductor device according to claim 1, wherein
the insulating protective film has a greater coefficient of linear thermal expansion than the interlayer insulating film.

5. The power semiconductor device according to claim 1, further comprising
a sealing member covering the electrode and the insulating protective film.

6. The power semiconductor device according to claim 5, wherein
the sealing member comprises a thermosetting resin.

7. The power semiconductor device according to claim 6, wherein
the thermosetting resin comprises an epoxy resin.

8. The power semiconductor device according to claim 5, wherein
the sealing member has a greater coefficient of linear thermal expansion than the insulating protective film.

9. The power semiconductor device according to claim 5, wherein
the interlayer insulating film has a smaller coefficient of linear thermal expansion than the sealing member.

10. The power semiconductor device according to claim 1, wherein
at least a portion of the semiconductor substrate comprises silicon carbide.

11. The power semiconductor device according to claim 1, wherein
the semiconductor substrate has a thickness of 100 μm or less.

12. The power semiconductor device according to claim 1, wherein
the insulating protective film has an opening having an area equal to or greater than half of an area of the semiconductor substrate.

13. The power semiconductor device according to claim 1, wherein
the outer edge of the electrode has a radius of curvature R3 at the corner of the termination region, the radius of curvature R3 being smaller than the radius of curvature R1.

14. The power semiconductor device according to claim 1, wherein
a radius of curvature of a curved portion of the outer edge of the interlayer insulating film and the radius of curvature of the inner edge of the insulating protective film each have a minimum value on an imaginary line corresponding to half an angle of the corner of the termination region.

15. The power semiconductor device according to claim 1, further comprising
a metal layer having an outer end surface on the electrode, wherein
the insulating protective film has an inner end surface opposing the outer end surface of the metal layer.

16. The power semiconductor device according to claim 15, wherein the inner end surface of the insulating protective film and the outer end surface of the metal layer are at least partially in contact with each other.

17. The power semiconductor device according to claim 15, wherein
the inner end surface of the insulating protective film and the outer end surface of the metal layer oppose each other with a gap therebetween, the gap at least partially separating the inner end surface of the insulating protective film and the outer end surface of the metal layer.

18. The power semiconductor device according to claim 1, wherein
the interlayer insulating film comprises silicon, boron, and phosphorus.

19. The power semiconductor device according to claim 18, wherein
the electrode has a grain boundary, and has a surface having a depression located at the grain boundary.

20. A power converter comprising:
a main conversion circuit to convert input power for output, the main conversion circuit including the power semiconductor device according to claim 1; and
a control circuit to output, to the main conversion circuit, a control signal to control the main conversion circuit.

* * * * *